United States Patent [19]
Takahashi et al.

[11] Patent Number: 5,602,723
[45] Date of Patent: Feb. 11, 1997

[54] SUBRACK DEVICE

[75] Inventors: Tsutomu Takahashi; Hiroshi Yamaji; Hisao Hayashi; Shigeru Amagasa; Takashi Sato; Tomoyuki Hongoh; Tetsuya Takahashi, all of Kawasaki; Kouichi Namimatsu, Fukuoka; Kazuaki Kashiwada, Kawasaki; Kenji Joukou, Kawasaki; Tetsuya Murayama, Kawasaki, all of Japan

[73] Assignee: Fujitsu Limited, Kanagawa, Japan

[21] Appl. No.: 545,460

[22] Filed: Oct. 19, 1995

[30] Foreign Application Priority Data

Mar. 6, 1995 [JP] Japan .................................. 7-045907

[51] Int. Cl.⁶ .................................................. H05K 7/14
[52] U.S. Cl. ........................ 361/800; 361/796; 361/816; 257/659
[58] Field of Search ................................. 361/796, 752, 361/753, 799, 818, 816, 729, 730, 800; 257/659, 660; 174/35 R; 439/108, 109; 333/246, 247

[56] References Cited

U.S. PATENT DOCUMENTS

| | | | |
|---|---|---|---|
| 4,352,146 | 9/1982 | Hermanutz et al. | 361/428 |
| 4,520,426 | 5/1985 | Wessely | 361/385 |
| 5,398,159 | 3/1995 | Andersson et al. | 361/695 |

Primary Examiner—Leo P. Picard
Assistant Examiner—Y. Whang

[57] ABSTRACT

This invention relates to a subrack device applicable for an SDH network, and more particularly to a subrack device which can be produced flexibly in response to a customer's need. The subrack device has a subrack body commonly used regardless of a type of the subrack device. The subrack body has a circuit-board-unit housing portion and an outer-connecting-board mounting portion. Circuit boards and outer-connecting-board connecting-boards of different types are prepared. The outer-connecting-board mounting portion has a plurality of outer-connecting-board mounting territories. The outer-connecting-boards are plugged in the outer-connecting-board mounting territories to produce the subrack device meeting the customer's need.

17 Claims, 29 Drawing Sheets

FIG. 2 PRIOR ART

|  | (LINE) 155Mbps | | 622Mbps | |
|---|---|---|---|---|
| 2 Mbps | 75 Ω $10_{-1}$ | 120 Ω $10_{-2}$ | 75 Ω $10_{-3}$ | 120 Ω $10_{-4}$ |
| 34 Mbps | 75 Ω $10_{-5}$ | 120 Ω $10_{-6}$ | 75 Ω $10_{-7}$ | 120 Ω $10_{-8}$ |
| 140 Mbps | — | | 75 Ω $10_{-9}$ | 120 Ω $10_{-10}$ |
| 155 Mbps | — | | 75 Ω $10_{-11}$ | 120 Ω $10_{-12}$ |
| 155Mbps 光 | — | | $10_{-13}$ | |

(TRIB)

$10_{-1} \sim 10_{-13}$ : Communication Systems

FIG. 4A PRIOR ART    FIG. 4B PRIOR ART
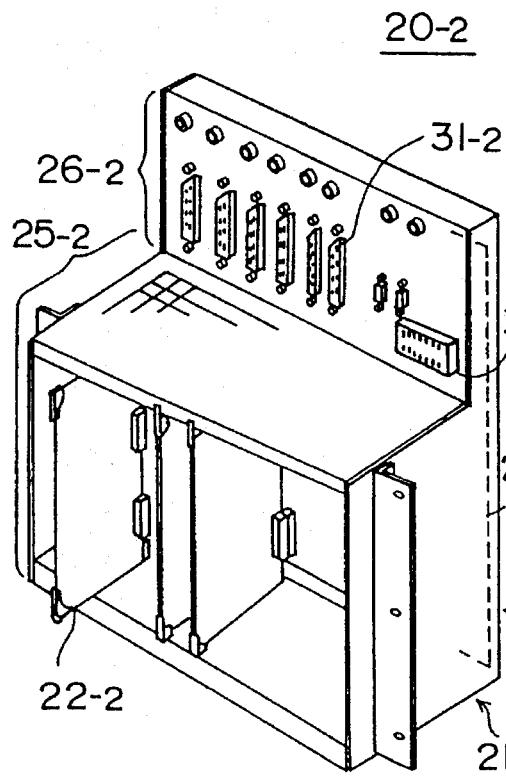
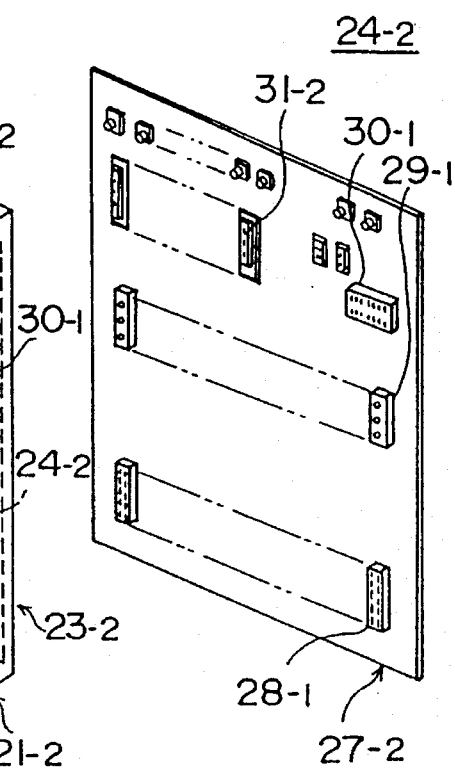
FIG. 4C PRIOR ART
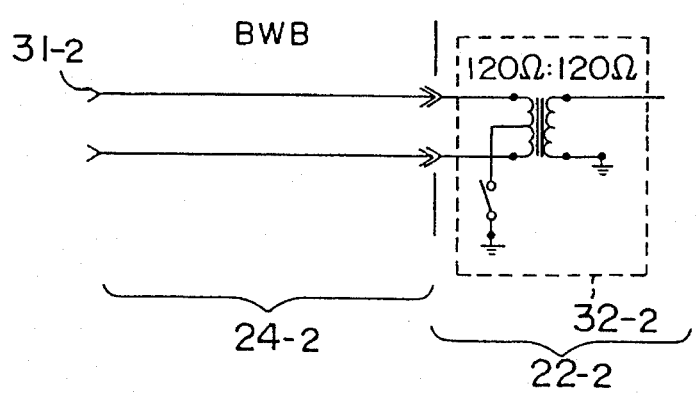

$d_1 < d_3 < d_2$

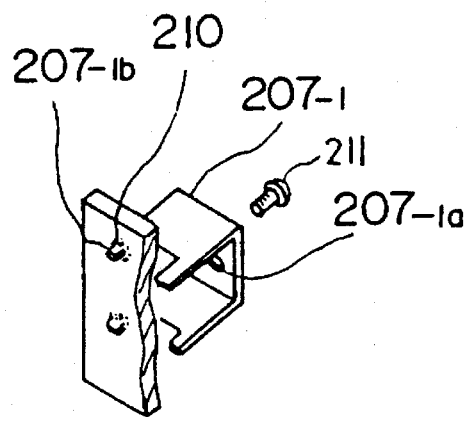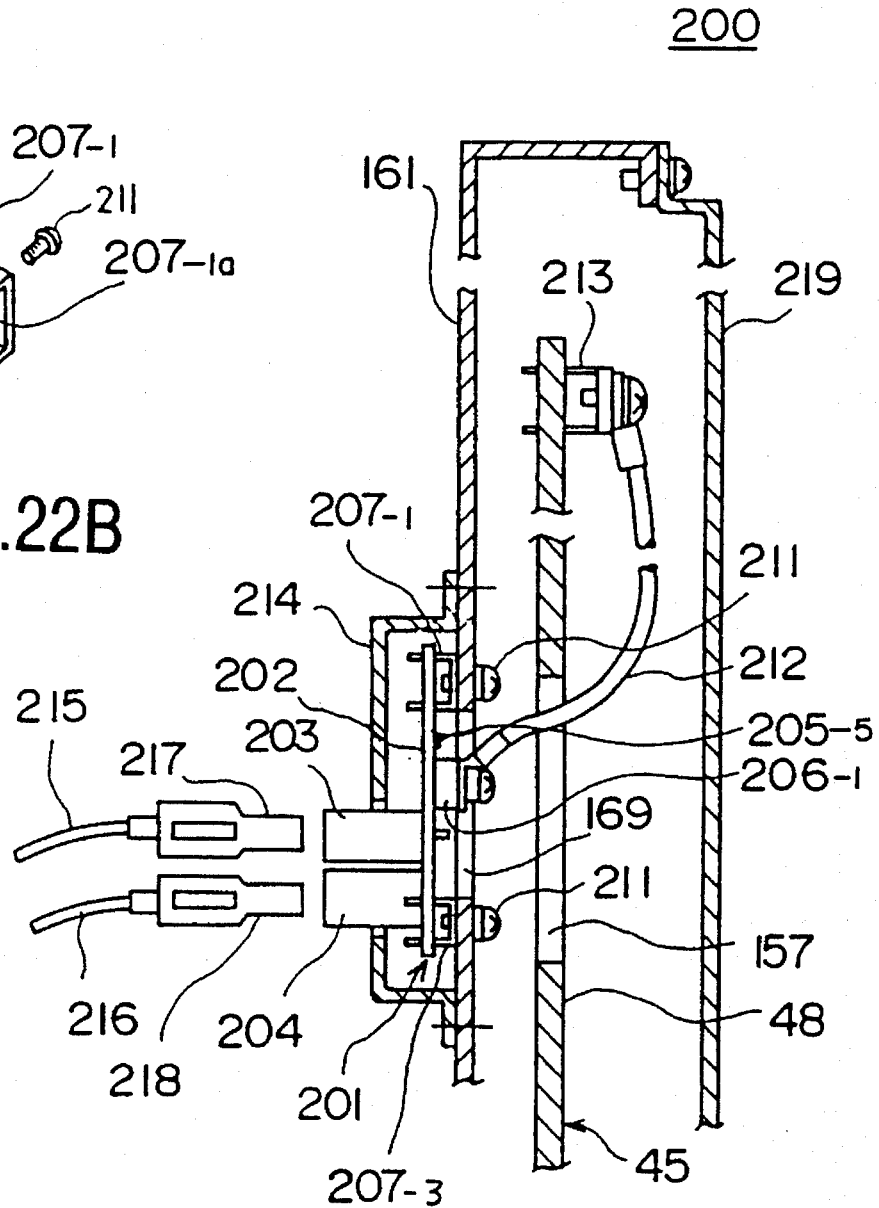
FIG.22B
FIG.22A $X_2 \leftarrow\rightarrow X_1$

SUBRACK DEVICE

BACKGROUND OF THE INVENTION

1. Field of the Invention

The present invention generally relates to a subrack device, and more particularly to a subrack device which is used in a communication system based on an SDH (Synchronous Digital Hierarchy).

There are various specifications for communication system based on the SDH. A subrack device which is used in the communication system based on the SDH is required to have a performance in response to a particular specification of the communication system. However, to reduce the production cost, the subrack device is required to be produced flexibly to handle any one of the various specifications of the subrack device.

2. Description of the Prior Art

One example of the communication system based on the SDH will now be described. FIG. 1 shows a communication system 10 based on the SDH. In FIG. 1, a network (LINE (a high-order group)) 10A based on the SDH is shown. Also, in FIG. 1, telephone stations $11_{-1}$–$11_{-4}$ are shown. Subrack devices 12 of the present invention are installed in the telephone stations $11_{-1}$–$11_{-4}$. The telephone stations $11_{-1}$–$11_{-4}$ communicate through optical-fibers 13. Each of the telephone stations $11_{-1}$–$11_{-4}$ has a non-synchronizing hierarchy network 15 (TRIB (a low-order group)). The non-synchronizing hierarchy network 15 comprises a non-synchronizing hierarchy network device 17 connected to the subrack device 12, a power-source 16 and a telephone device 18.

The communication system 10, as described above, has the network (LINE (a high-order group)) 11 based on the SDH and the non-synchronizing hierarchy network 15 (TRIB (a low-order group)). The communication system 10 classifies communication systems $10_{-1}$–$10_{-13}$ shown in FIG. 2, based on a fundamental bit rate for multiplying signals. As shown in FIG. 2, the communication system $10_{-1}$ comprises a synchronizing network 10A having a fundamental bit rate of 155 Mbps, and a non-synchronizing network 15 having a fundamental bit rate of 2 Mbps and an impedance of 75Ω. The communication system $10_{-2}$ comprises a synchronizing network having a fundamental bit rate of 155 Mbps, and a non-synchronizing network having a fundamental bit rate of 2 Mbps and an impedance of 120Ω. The communication system $10_{-3}$ comprises a synchronizing network having a fundamental bit rate of 622 Mbps, and a non-synchronizing network having a fundamental bit rate of 2 Mbps and an impedance of 75Ω. The communication system $10_{-4}$ comprises a synchronizing network in which a fundamental bit rate is 622 Mbps and a non-synchronizing network in which a fundamental bit rate is 2 Mbps and an impedance is 120Ω. The communication system $10_{-7}$ comprises a synchronizing network in which a fundamental bit rate is 622 Mbps and a non-synchronizing network in which a fundamental bit rate is 34 Mbps and an impedance is 75Ω.

FIGS. 3A, 3B and 3C are schematic illustrations showing a subrack device applicable for the communication system $10_{-1}$ shown in FIG. 2. More particularly, FIG. 3A is a perspective view showing a subrack device, FIG. 3B is a perspective view showing a back-wiring-board (BWB) assembly and FIG. 3C is a circuit diagram showing a circuit-board-unit.

As shown in FIG. 4A, the subrack device $20_{-1}$ has a subrack body $21_{-1}$ in which a plurality of circuit-board-units $22_{-1}$ are mounted. The subrack body $21_{-1}$ has a chassis assembly $23_{-1}$ made of a metal plate, and a back-wiring-board (BWB) assembly $24_{-1}$ is incorporated therein. The subrack body $21_{-1}$ has a box-shaped circuit-board-unit housing portion $25_{-1}$ and an outer connector arranging portion $26_{-1}$ standing at a back face of the circuit-board-unit housing portion $25_{-1}$. The BWB assembly $24_{-1}$ has a BWB $27_{-1}$ in which connectors $28_{-1}$, $29_{-1}$ for the circuit-board-units, a power-source receiving connector $30_{-1}$ and an outer connector $31_{-1}$ are mounted. The circuit-board-unit $22_{-1}$ has a 75Ω impedance conversion transformer $32_{-1}$, as shown in FIG. 4C. The subrack device $20_{-1}$ is used in the communication system $10_{-1}$ and is installed in the telephone station $11_{-1}$ in FIG. 1. The optical-fiber 13 is connected to the circuit-board-unit $22_{-1}$ and an electrical wire $16_{-1}$ is connected to the outer connector $31_{-1}$ for an operation.

FIGS. 4A, 4B and 4C are schematic illustrations showing a subrack device applicable for the communication system $10_{-2}$ shown in FIG. 2. More particularly, FIG. 4A is a perspective view showing a subrack device, FIG. 4B is a perspective view showing a back-wiring-board (BWB) assembly and FIG. 4C is a circuit diagram showing a circuit-board-unit.

As shown in FIG. 4A, the subrack device $20_{-2}$ has a subrack body $21_{-2}$ in which a plurality of circuit-board-units $22_{-2}$ are mounted. The subrack body $21_{-2}$ has a chassis assembly $23_{-2}$ made of a metal plate and a back-wiring-board (BWB) assembly $24_{-2}$ is incorporated therein. The subrack body $21_{-2}$ has a box-shaped circuit-board-unit housing portion $25_{-2}$ and an outer connector arranging portion $26_{-2}$ standing at a back face of the circuit-board-unit housing portion $25_{-2}$. The BWB assembly $24_{-2}$ has a BWB $27_{-2}$ in which the connectors $28_{-1}$, 291 for the circuit-board-unit, the power-source receiving connector $30_{-1}$ and an outer connector $31_{-2}$ are mounted. The circuit-board-unit $22_{-2}$ has a 120Ω impedance conversion transformer $32_{-2}$, as shown in FIG. 4C. The subrack device $20_{-2}$ is used in the communication system $10_{-2}$ and is installed in the telephone station $11_{-2}$ in FIG. 1. The optical-fiber 13 is connected to the circuit-board-unit $22_{-2}$ and the electrical wire $16_{-2}$ is connected to the outer connector $31_{-2}$ for an operation.

As is understood from the above description, a manufacturer has to design and produce different types of the chassis body $23_{-1}$ ($23_{-2}$), the BWB assembly $24_{-1}$ ($240_{-2}$) and the circuit-board-unit $22_{-1}$ ($22_{-2}$) for each communication system. Therefore, the production cost of the subrack device is high.

SUMMARY OF THE INVENTION

Accordingly, it is a general object of the present invention to provide a novel and useful subrack device by which the production cost thereof can be reduced.

The above object of the present invention is achieved by a subrack device comprising a subrack body comprising a chassis assembly and a back-wiring-board assembly, the subrack body having a circuit-board-unit housing portion in which a circuit-board-unit is accommodated and an outer-connecting-board mounting portion in which an outer-connecting-board is plugged, the outer-connecting-board mounting portion having a first connector and a circuit-board-unit which is accommodated in the circuit-board-unit housing portion of the subrack body, the circuit-board-unit being connected to the back-wiring-board assembly, the outer-connecting-board connected to the first connector, the outer-connecting-board being plugged in the outer-connecting-board mounting portion of the subrack body by connecting the second connector to the first connector, the outer-connecting-board being selected from outer-connecting-boards having different functions and different outer connectors in response to the different functions.

In the present invention, when different subrack device is produced, the same subrack body can be used. Also, since the outer-connecting-board can be plugged in the outer-connecting-board mounting portion, the outer-connecting-board can be produced separately from the subrack body.

According to the present invention, the subrack body, circuit-board-unit and the outer-connecting-portion can be produced and stocked separately. The subrack device required by customers can be produced by connecting the circuit-board-unit to the subrack body and plugging the selected outer-connecting-board in the outer-connecting-board mounting portion. Thus, the subrack device can be produced effectively compared with a conventional subrack device whose production process starts from building a subrack body. Also, since the same subrack body can be used commonly in all the subrack device, a number of the subrack body can be produced economically. Thus, the production cost of the subrack device can be reduced. Further, from customers' side, by only replacing the outer-connecting-board to another, another subrack device can be produced economically.

In the above invention, the outer-connecting-board mounting portion can have a plurality of outer-connecting-board mounting territories, each of the outer-connecting-board mounting territories designed to be mounted by one of the outer-connecting-boards. In the above invention, since the outer-connecting-board mounting portion can have a plurality of the outer-connecting-board mounting territories, a plurality of outer-connecting-boards can be mounted in the outer-connecting-board mounting portion.

In the above invention, the outer-connecting-board can have a rectangular shape and the outer-connecting-board is arranged facing the outer-connecting-board mounting portion. Thus, the outer-connecting-board is prevented from protruding forward. Accordingly, when outer connection cables to be connected to the outer-connecting-board is provided, the area of a dead space can be reduced and the outer connection cables can be provided efficiently.

In the above invention, the outer-connecting-board mounting portion can be a part of the chassis assembly used for a grounding, the outer-connecting-board comprising a circuit board assembly and a rectangular shield box in which the circuit board assembly is accommodated, and a back face of the shield box contacts with the chassis assembly when the outer-connecting-board is mounted on the outer-connecting-board mounting portion. In the invention, an electromagnetic noise is prevented from leaking from the outer-connecting-board.

In the above invention, the outer-connecting-board mounting portion can have a positioning hole, the outer-connecting-board protruding from a back side of the outer-connecting-board mounting portion, the outer-connecting-board having a positioning pin having a tapered or spherical tip end, the positioning pin being engaged with the positioning hole when the outer-connecting-board is mounted. According to the invention, when the outer-connecting-board is plugged in the outer-connecting-portion mounting portion, the outer-connecting-portion can be positioned without using tools.

In the above invention, the outer-connecting-board mounting portion can have a vertical wall plate of the chassis assembly and a back-wiring-board assembly positioned in a back side of the vertical wall plate, the outer-connecting-board having a positioning pin protruding from a back side of the outer-connecting-board, the back-wiring-board assembly comprising a back-wiring-board and the first connector mounted on the back-wiring-board, the back-wiring-board having a positioning hole with which the positioning pin is engaged, the vertical wall plate having a positioning hole with which the positioning pin is engaged loosely, the positioning pin first engaging with the positioning holes of the vertical wall plate and secondly engaging with the positioning hole of the back-wiring-board when the outer-connecting-board is mounted. According to the invention, even when the outer-connecting-board is positioned roughly, the outer-connecting-board can be plugged in the outer-connecting-board mounting portion. Therefore, the connection can be conducted efficiently.

In the above invention, the circuit board assembly can have an impedance conversion transformer. According to the invention, regardless of the impedance of the device connected to the subrack device through an outer cables, the same circuit-board-unit can be used. Thus, the circuit-board-unit is not required to have an impedance conversion transformer and the production cost can be reduced.

In the above invention, the circuit board assembly can have a filtering circuit. According to the invention, a noise level leaking outside can be repressed efficiently.

In the above invention, the subrack body can further have a circuit board assembly having a power-source connector and a filtering circuit, and fixing/connecting means for fixing mechanically the circuit board assembly to the chassis assembly at a plurality of points and connecting electrically the filtering circuit to the chassis assembly at a plurality of points. According to the present invention, electric connecting means is not required to connect the filtering circuit to the chassis assembly. Also, since the filtering circuit is connected to the chassis assembly at a plurality of points, filtering characteristics can be improved.

In the above invention, the circuit-board-unit housing portion of the subrack body can have a reinforcing plate member, the reinforcing plate member having a notch at an insertion side thereof, the reinforcing plate member being provided vertically in the circuit-board-unit housing portion. In the invention, due to the notch formed in the reinforcing plate member, when the circuit-board-unit is inserted improperly, a space accepting the connector positioned at front side of the circuit-board-unit. Thus, the circuit-board-unit can be inserted from damaging the connector. That is, the circuit-board-unit is prevented from being damaged during fabrication process. Also, if the notched is not formed, a width of the reinforcing plate member must be wider. Thus, due to the notch, a mounting space for circuit-board-unit can be broadened.

In the above invention, the circuit-board-unit can have a unit insertion/removing tool, the circuit-board-unit housing portion of the subrack body having a receiving member with which the unit insertion/removing tool is engaged when the circuit-board-unit is mounted, and the receiving member having a cross section having a tip head shape in an insertion direction of the circuit-board-unit. In the invention, when the card lever is turned, the position of the circuit-board-unit when the card lever is engaged with the receiving member is distinct from that when the card lever is not engaged with the receiving member. Therefore, even when the circuit-board-unit is not inserted properly, the circuit-board-unit is prevented from being damaged by an operation of the card lever.

In the above invention, the subrack body further can have an optical-fiber handling portion which handles an excess length of the optical-fiber, the optical-fiber handling portion comprising an optical-fiber housing member in which the optical-fiber handled by the optical-fiber handling portion is accommodated and a lid member which covers the optical-fiber housing member, the optical-fiber housing member comprises a vertical wall portion and a flange portion extending inside of the optical-fiber housing member from a top of the optical-fiber housing member. According to the invention, the optical-fibers can be handled easily without a protuberance of the optical-fiber. The optical-fibers are prohibited from being placed between the lid and an optical-fiber housing portion.

In the above invention, the lid member can be transparent. According to the invention, the optical-fiber, particularly, how the excess length is handled, how the optical-fiber moves when the circuit board is mounted or removed, can be observed from outside. If necessary, the optical-fibers can be rehandled in order to improve a reliance of the subrack device.

In the above invention, the optical-fiber housing member can have a bottom-plate portion inclined upward toward a back side thereof. In this invention, the inclined bottom plate define a pass for an air current from the circuit board housing unit. Therefore, the air current in the circuit-board-unit housing portion and a heat release efficiency thereof can be improved.

In the above invention, the chassis body has a side plate, the side plate having a handle relatively formed by forming an opening in the side plate. According to the present invention, since another handle part is not required, the subrack device can be produced economically. Also, the optical cables can be fixed securely.

In the above invention, the chassis body can have a side plate, the side plate having a notch portion through which an optical-fiber is introduced into the chassis body. According to the invention, the optical-fiber can be introduced in the subrack device without bending and damaging the optical-fibers.

In the above invention, the back-wiring-board assembly can have only press-fit parts mounted on the back-wiring-board, the outer-connecting-board having a circuit board assembly, the circuit board assembly having only solder-jointed parts mounted on the circuit board. According to the invention, the soldering is not required in fabrication of the back-wiring-board and the press-fitting is not required in fabrication of the circuit board assembly.

Other objects and further features of the present invention will be apparent from the following detailed description when read in conjunction with the accompanying drawings.

BRIEF DESCRIPTION OF THE DRAWINGS

FIG. 2 is a table showing a specification of the communication system shown in FIG. 1;

FIG. 4A is a perspective view showing another subrack device applicable for another communication system shown in FIG. 2;

FIG. 4B is a perspective view showing a back-wiring-board (BWB) assembly;

FIG. 4C is a circuit diagram showing a circuit-board-unit;

FIG. 22 is a schematic illustration showing a power-source receiving portion;

DESCRIPTION OF THE PREFERRED EMBODIMENTS

Figure 1:
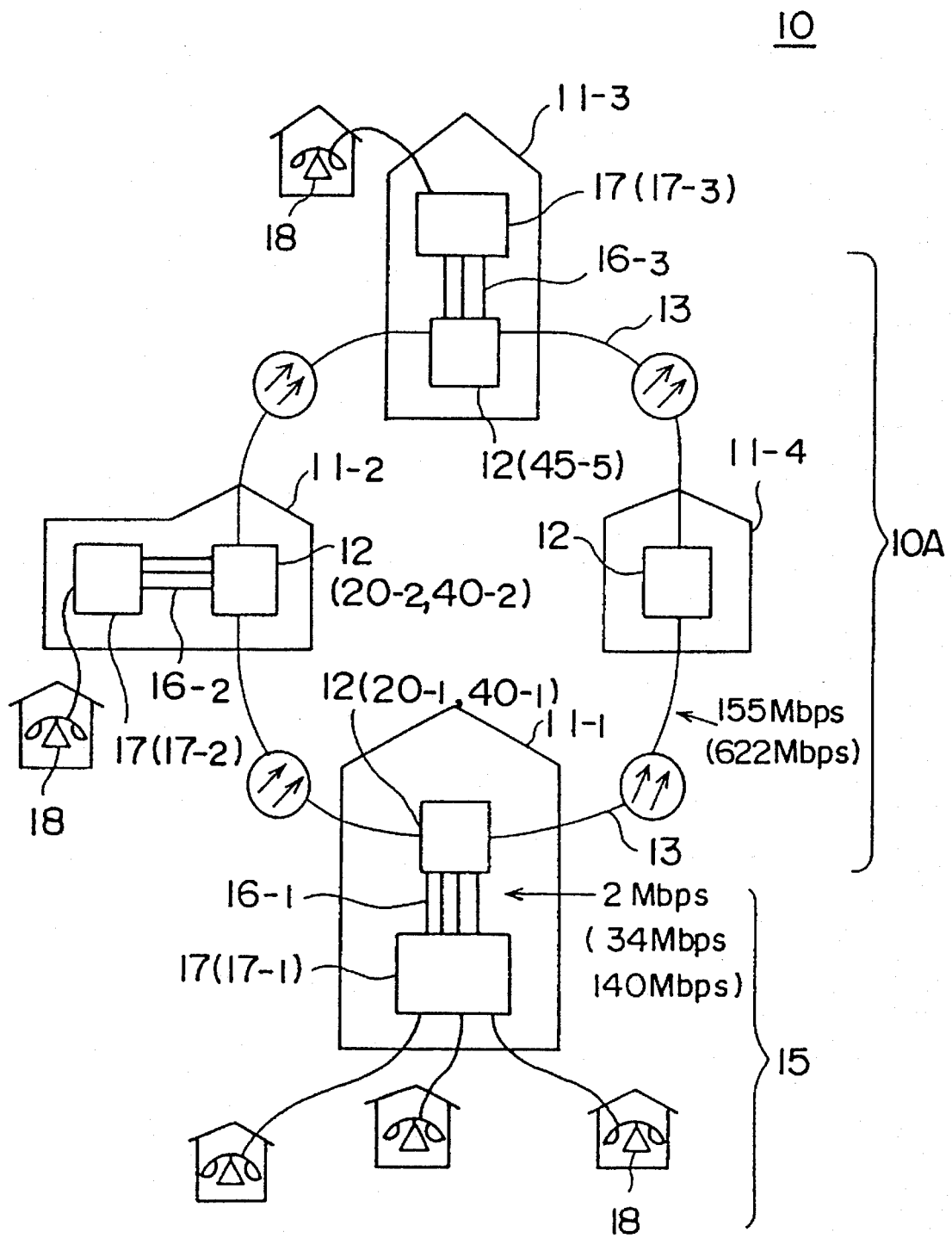
FIG. 1 is a schematic illustration showing a communication system based on a SDH.
Figure 3A:
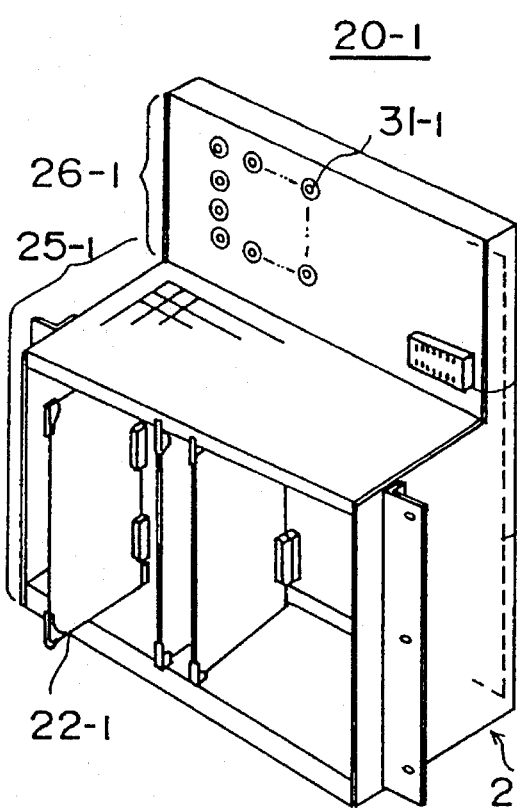
FIG. 3A is a perspective view showing a subrack device applicable for the communication system shown in FIG. 2.
Figure 3B:
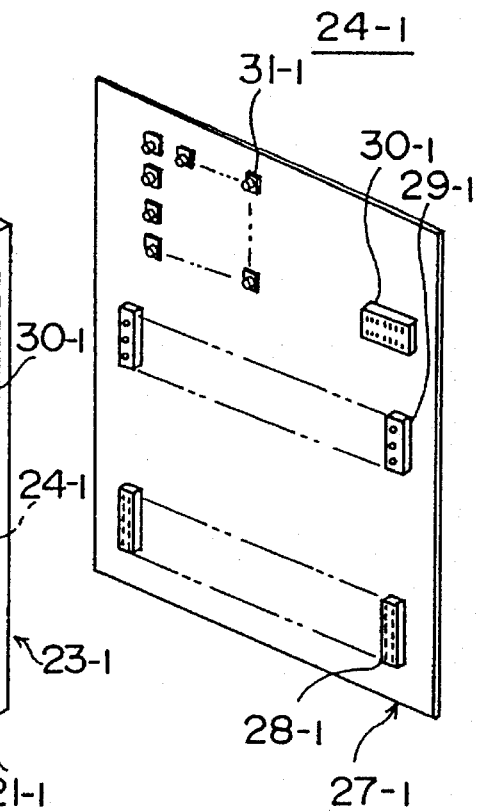
FIG. 3B is a perspective view showing a back-wiring-board (BWB) assembly.
Figure 3C:
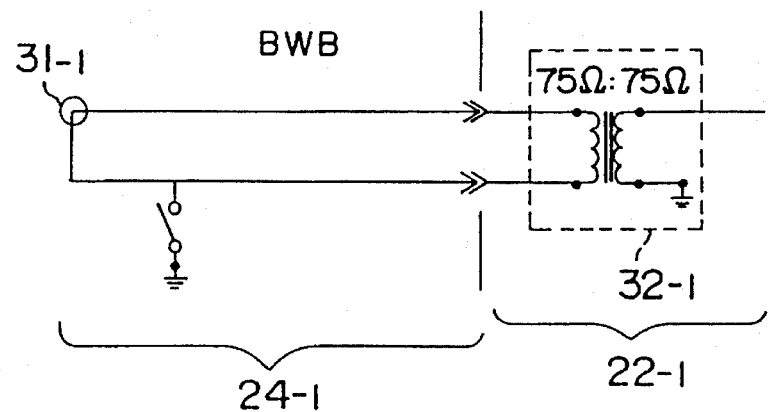
FIG. 3C is a circuit diagram showing a circuit-board-unit.

The preferred embodiments of the present invention will now be described in further detail with reference to the accompanying drawings.

For a better understanding of the embodiment of the present invention, an index of the description of the preferred embodiment is listed below.

| | |
|---|---|
| I | Rough Structure of the Subrack Device |
| I-1 | Features of the Subrack Device |
| I-2 | Structure of the Subrack Device |
| I-3 | Characteristics of the Subrack Device |
| II | Embodiment of the Subrack Device |
| II-1 | Whole Structure of the Subrack Device |
| II-2 | Rough Structure of an Outer-Connection-Board Mounting Portion of the Subrack Body |
| II-3 | Structure of the Subrack Device |
| II-4 | Subrack Body |
| II-5 | Outer Connection Board $60_{-1}$ |
| II-6 | Mounting Outer Connection Board $60_{-1}$ |
| II-7 | Structure and Mounting of another Outer Connection Board $60_{-2}$, $110_{-1}$, $110_{-2}$, 111 |
| II-8 | Electrical Circuit of the Outer Connection Board |
| II-9 | Structure of Power-Source Receiving Territory |
| II-10 | Blank Block |
| II-11 | Optical-Fiber Handling Portion |
| II-12 | Structure Relating to the Optical-Fiber Handling Portion |
| II-13 | Reinforcing Board of a Circuit-Board-Unit Housing Portion |
| II-14 | Receiving Member of the Circuit-Board-Unit Housing Portion |
| III | Subrack Device of Another Embodiment |

I Rough Structure of the Subrack Device

For a better understanding of the invention, a rough structure of a subrack device of a first embodiment of the present invention will be described. In this embodiment, both a subrack device $40_{-1}$ applicable for the communication system $10_{-1}$ and a subrack device $40_{-2}$ applicable for the communication system 102 are produced flexibly. The subrack device $40_{-1}(40_{-2})$ comprises a common structure 41 which is used for both of the communication systems $10_{-1}$, $10_{-2}$ and an outer-connecting-board $60_{-1}(60_{-2})$ which is provided for the selected one of the communication systems $10_{-1}$, $10_{-2}$.

I-1 Features of the Subrack Device

The common structure 41 comprises a subrack body 42 and a circuit-board-unit 43.

The subrack body 42 comprises a chassis body 44 and a back-wiring-board (BWB) assembly 45 installed in the chassis body 44. The chassis body 44 comprises a circuit-board-unit housing portion 46 which is provided in a lower part thereof in which a circuit-board-unit 43 is accommodated and an outer-connecting-board mounting portion 47 which is provided in an upper part thereof. The BWB assembly 45 comprises a BWB 48, a circuit-board-unit connector 49 mounted in the BWB 48 and an outer-connecting-board connector 50 serving as a first connector which is also mounted in the BWB 48. The circuit-board-unit connector 49 is provided in the circuit-board-unit housing portion 46 of the chassis assembly 44. The outer-connecting-board connector 50 is provided in the outer-connecting-board mounting portion 47 of the chassis assembly 44.

Referring to FIG. 2, the circuit-board-unit 43 has a circuit which processes multiplied synchronizing signals in which a fundamental bit rate is 155 Mbps. In the circuit-board-unit 43, no circuit which processes non-synchronizing signals is provided. Thus, the circuit-board-unit 43 is used by both the communication system $10_{-1}$ and the communication system $10_{-2}$. The circuit-board-unit 43 is inserted in the circuit-board-unit housing portion 46 and is connected to the circuit-board-unit connector 49. A front face of the circuit-board-unit housing portion 46 is sealed by a cover member (not shown).

Figure 5:
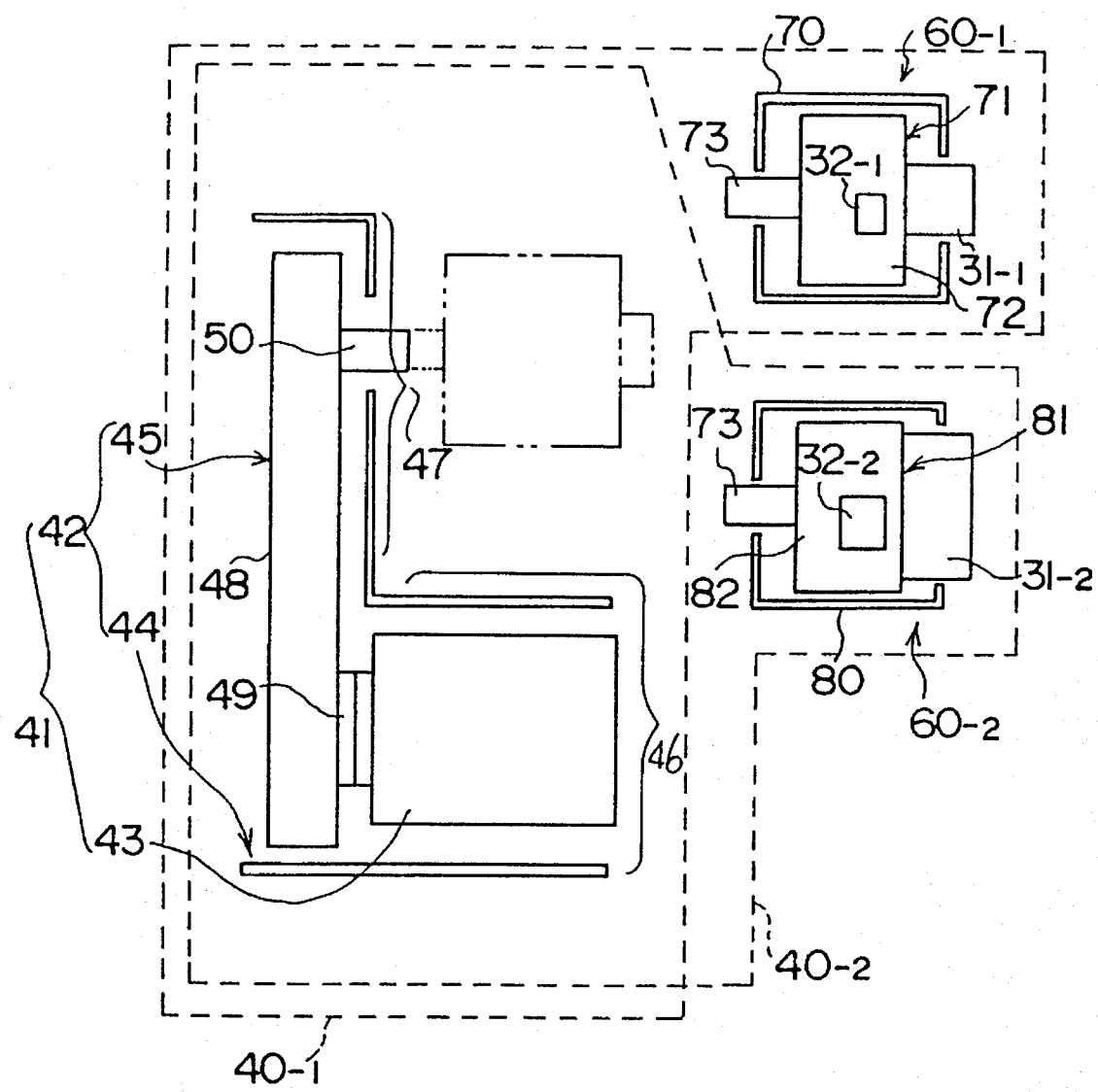
FIG. 5 is a schematic illustration showing a subrack device.

Referring to FIGS. 1, 2 and 5, the outer-connecting-board connecting-board 601 corresponds to a non-synchronizing hierarchy network device171 of a fundamental bit rate 2 Mbps and an impedance of 75Ω. The outer-connecting-board $60_{-1}$ has a structure in which a circuit board assembly 71 is accommodated in a shield box 70 made of metal. The circuit board assembly 71 comprises a circuit board 72, a second connector 73 mounted on a rear face of the circuit board 72, and an outer connector 311 mounted on a front face of the circuit board 72. The connector 73 can be connected to the above connector 50. The outer connector $31_{-1}$ has a structure corresponding to the above non-synchronizing hierarchy network device$17_{-1}$. The circuit board assembly 71 further has an impedance conversion transformer $32_{-1}$ which converts an impedance to 75Ω. The connector 73 is exposed from a rear face of the shield box 70.

Referring to FIGS. 1, 2 and 5, the outer-connecting-board connecting-board $60_{-2}$ corresponds to the non-synchronizing hierarchy network device$17_{-2}$ of a fundamental bit rate of 2 Mbps and an impedance of 120 Ω. The outer-connecting-board $60_{-2}$ has a structure in which a circuit board assembly 81 is accommodated in a shield box 80 made of metal. The circuit board assembly 81 comprises a circuit board 82, a second connector 73 mounted on a rear side of the circuit board 82, and an outer connector $31_{-2}$ mounted on a front face of the circuit board 82. The outer connector $31_{-2}$ has a structure corresponding to the above non-synchronizing hierarchy network device$17_{-2}$. The circuit board assembly 81 further has an impedance conversion transformer $32_{-2}$ which converts an impedance to 120 Ω in the circuit board assembly 81. The second connector 73 is exposed from a rear face of the shield box 80, and the outer connector $31_{-2}$ is exposed from a front face of the shield box 80. The subrack devices $40_{-1}$, $40_{-2}$ comprise the above features.

I-2 Structure of the Subrack Device

In order to fabricate the subrack device $40_{-1}$ applicable for the communication system $10_{-1}$, the outer-connecting-board $60_{-1}$ is plugged in the outer-connecting-board mounting portion 47 of the common structure 41. The subrack device $40_{-1}$ has an electrical structure shown in FIG. 6. The BWB assembly 45 is electrically connected to the circuit-board-unit 43 and to the outer-connecting-board $60_{-1}$. Referring to FIG. 1, the subrack device $40_{-1}$ is installed in the telephone station $11_{-1}$ having the non-synchronizing hierarchy network device$17_{-1}$ and is wired in the following way. First, the subrack device $40_{-1}$ is connected to the telephone stations $11_{-2}$, $11_{-4}$, that is, optical-fibers 13 constituting the network based on the SDH are connected to the circuit-board-unit 43. Second, a connector (not shown) provided at an end of the wire $16_{-1}$ led from the above non-synchronizing hierarchy network device$17_{-1}$ is connected to the outer connector $31_{-1}$. In the above structure, the subrack device $40_{-1}$ constitutes the communication system $10_{-1}$to be operated.

In the subrack device $40_{-2}$ applicable for the communication system $10_{-2}$ in FIG. 2, the outer connecting board $60_{-2}$ is plugged in the outer-connecting-board connecting-board mounting portion 47 of the common structure 41. The subrack device $40_{-2}$ has an electrical structure shown in FIG. 7. The BWB assembly 45 is electrically connected to the circuit-board-unit 43 and to the outer-connecting-board $60_{-2}$. In FIG. 1, the subrack device $40_{-2}$ is installed in the telephone station $11_{-2}$ having the non-synchronizing hierarchy network device$17_{-2}$ and is wired in the following way. First, the subrack device $40_{-2}$ is connected to the telephone stations $11_{-1}$, $11_{-3}$, that is, the optical-fibers 13 constituting the network based on the SDH are connected to the circuit-board-unit 43. Second, a connector (not shown) provided at an end of the wire $16_{-2}$ led from the above device $17_{-2}$ is connected to the outer connector $31_{-2}$. In the above structure, the subrack device $40_{-2}$ constitutes the communication system $10_{-2}$ to be operated.

I-3 Characteristics of the Subrack Device

Characteristics of the subrack devices $40_{-1}$, $40_{-2}$ will be described.

Though a manufacturer must prepare different types of outer-connecting-boards $60_{-1}$, $60_{-2}$ corresponding to different types of the communication system, only one type of the common structure 41, which is a main part of the subrack, is required. Therefore, a production cost for the common structure 41 can be reduced. As a result, a production cost for the whole subrack device can be reduced compared with a conventional subrack device prepared for each type of communication device. The subrack device applicable for a desired communication system can be produced by providing the outer-connecting-board corresponding to the desired communication system 10 on the common structure 41 serving as a base. Thus, a time required for production can be shortened.

II Embodiment of the Subrack Device

II-1 Whole Structure of the Subrack Device

Next, the concrete structure of the subrack device roughly described above will be described in detail.

Figure 8:
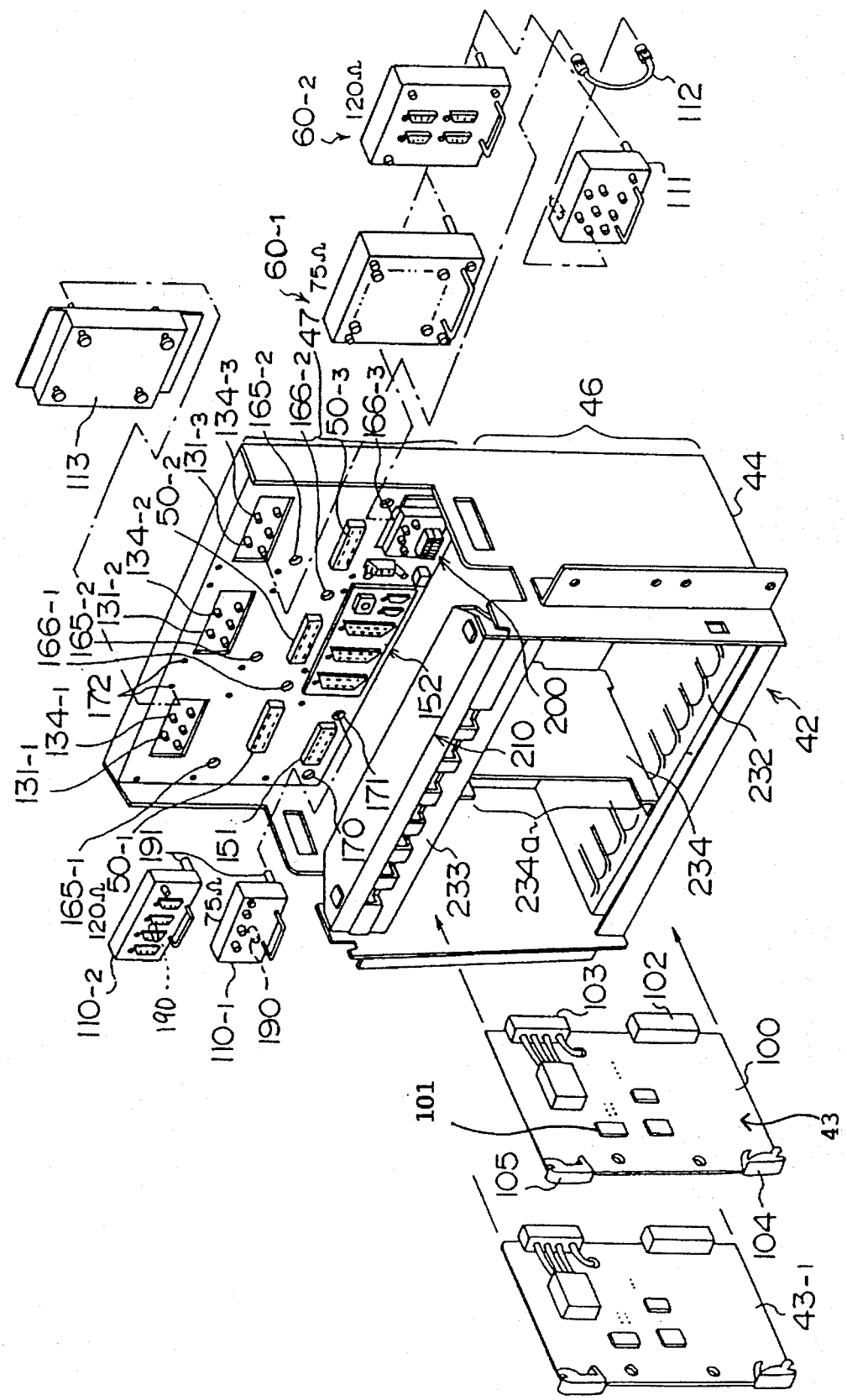
FIG. 8 is a perspective fabrication view showing a subrack device.

FIG. 8 is a perspective fabrication view showing a subrack device, which can be applicable for the communication systems $10_{-1}$–$10_{-13}$. In FIG. 8, the same features as those previously described in FIG. 5 will be denoted by the same reference numerals.

Parts which are required for the production of the subrack device will be listed and described below.

(1) Subrack body 42

Regardless of a type of the communication system, a subrack body 42 is used commonly when the subrack device is produced. The structure thereof will be described later.

(2) Circuit-board-unit 43

A circuit-board-unit 43 is used when the subrack device applicable for the communication systems $10_{-1}$, $10_{-2}$ is produced. The circuit-board-unit 43 has a circuit board 100, electrical parts 101, connectors 102, 103 and card levers 104, 105 serving as unit insertion tools.

(3) A Circuit-board-unit $43_{-1}$

A circuit-board-unit $43_{-1}$ is used when the subrack device applicable for the communication system $10_{-3}$ is used. Another circuit-board-unit (not shown) used when a subrack device applicable for another communication system is used, is prepared in advance.

(4) Outer connecting board $60_{-1}$

An outer-connecting-board $60_{-1}$ is used when the subrack device $40_{-1}$ applicable for the common structure $10_{-1}$ is produced. A detailed structure thereof will be described later.

(5) Outer connecting board $60_{-2}$

An outer-connecting-board $60_{-2}$ is used when the subrack device $40_{-2}$ applicable for the communication system $10_{-2}$ is produced. A detailed structure thereof will be described later.

(6) Outer connecting board $110_{-1}$

An outer-connecting-board $110_{-1}$ is used when clock signal is supplied to the non-synchronizing hierarchy network device having an impedance of 75 $\Omega$.

(7) Outer connecting board $110_{-2}$

An outer-connecting-board $110_{-2}$ is used when a clock signal is supplied to the non-synchronizing hierarchy network device having an impedance of 120 $\Omega$.

(8) Outer connecting board 111

An outer-connecting-board 111 is used when the subrack device applicable for the communication system $10_{-5}$ is produced.

(9) Coaxial cable 112

A coaxial cable 112 is used when the above outer-connecting-board 111 is used.

(10) Blank block 113

A blank block 113 is used in order to cover a blank outer-connecting-board mounting territory, when it is required.

II-2 Rough Structure of Outer-Connection-Board Mounting Portion of the Subrack Body Next, a rough structure of the outer-connecting-board mounting portion 47 of the subrack body 42 and a relationship in size between the outer-connecting-board mounting territory and the outer-connecting-board will be described.

Figure 9:
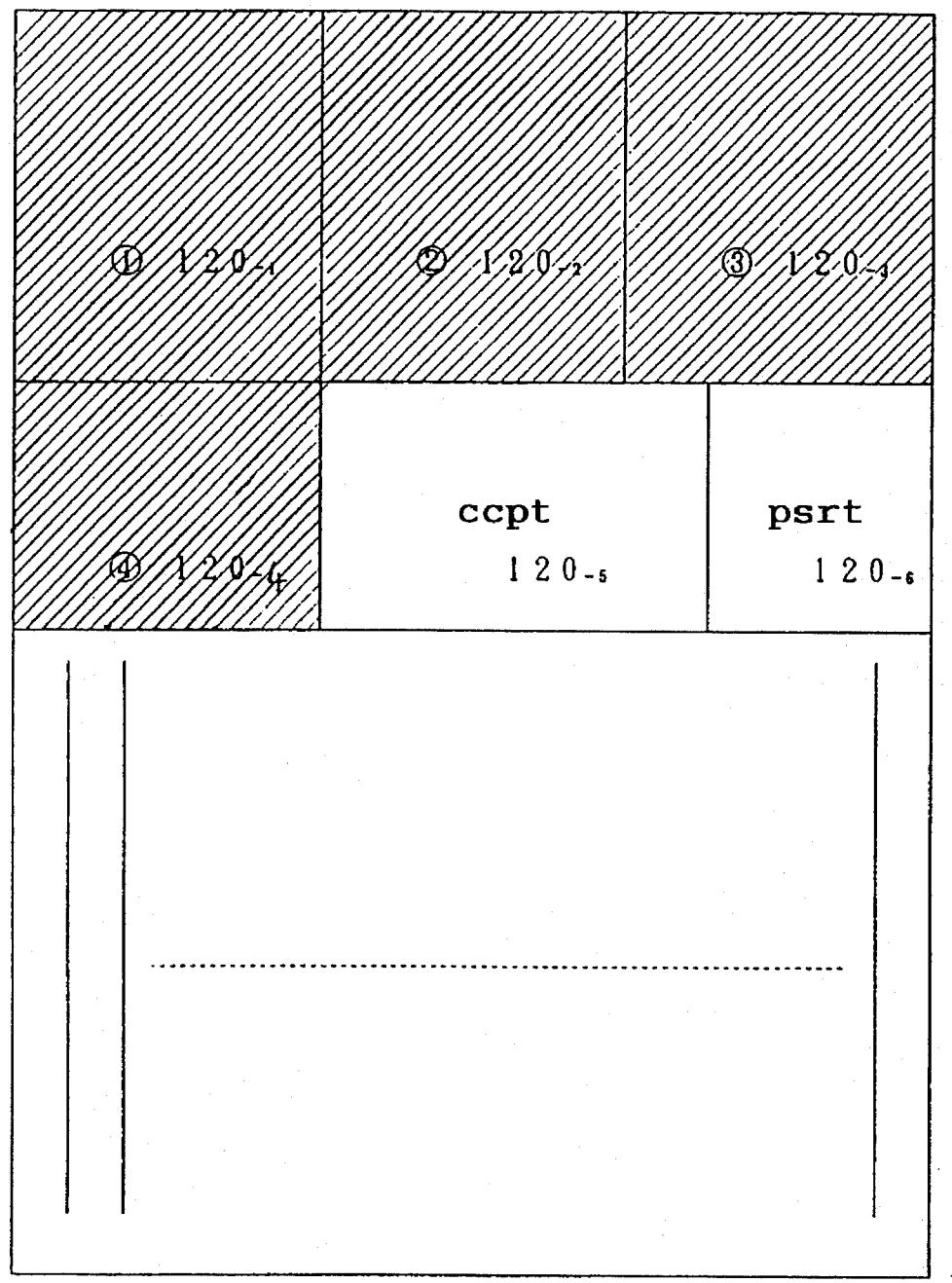
FIG. 9 is a schematic illustration showing an outer-connecting-board mounting portion.

The outer-connecting-board mounting portion 47 of the subrack body 42, as shown in FIG. 9, comprises outer-connecting-board mounting territories $120_{-1}$, $120_{-2}$, $120_{-3}$, $120_{-4}$, a common-connecting-portion territory $120_{-5}$ and a power-source receiving territory $120_{-6}$. The outer-connecting-board mounting territories $120_{-1}$, $120_{-2}$, $120_{-3}$ arranged horizontally in the upper portion have the same size. The rear faces of the outer-connecting-boards $60_{-1}$, $60_{-2}$ and the blank block 113 have the same size as the above outer-connecting-board mounting territories. The outer-connecting-boards $110_{-1}$, $110_{-2}$ have the same size as that of the outer-connecting-board mounting territory $120_{-4}$. The outer-connecting-board 111 has the same size as a territory which is an outer-connecting-board mounting territory $120_{-3}$ divided by two vertically. The outer-connecting-board $60_{-1}$ is plugged in the outer-connecting-board mounting portion 47.

II-3 Structure of the Subrack Device

Next, the structure of the subrack device applicable for each communication system will be described.

Figure 10:
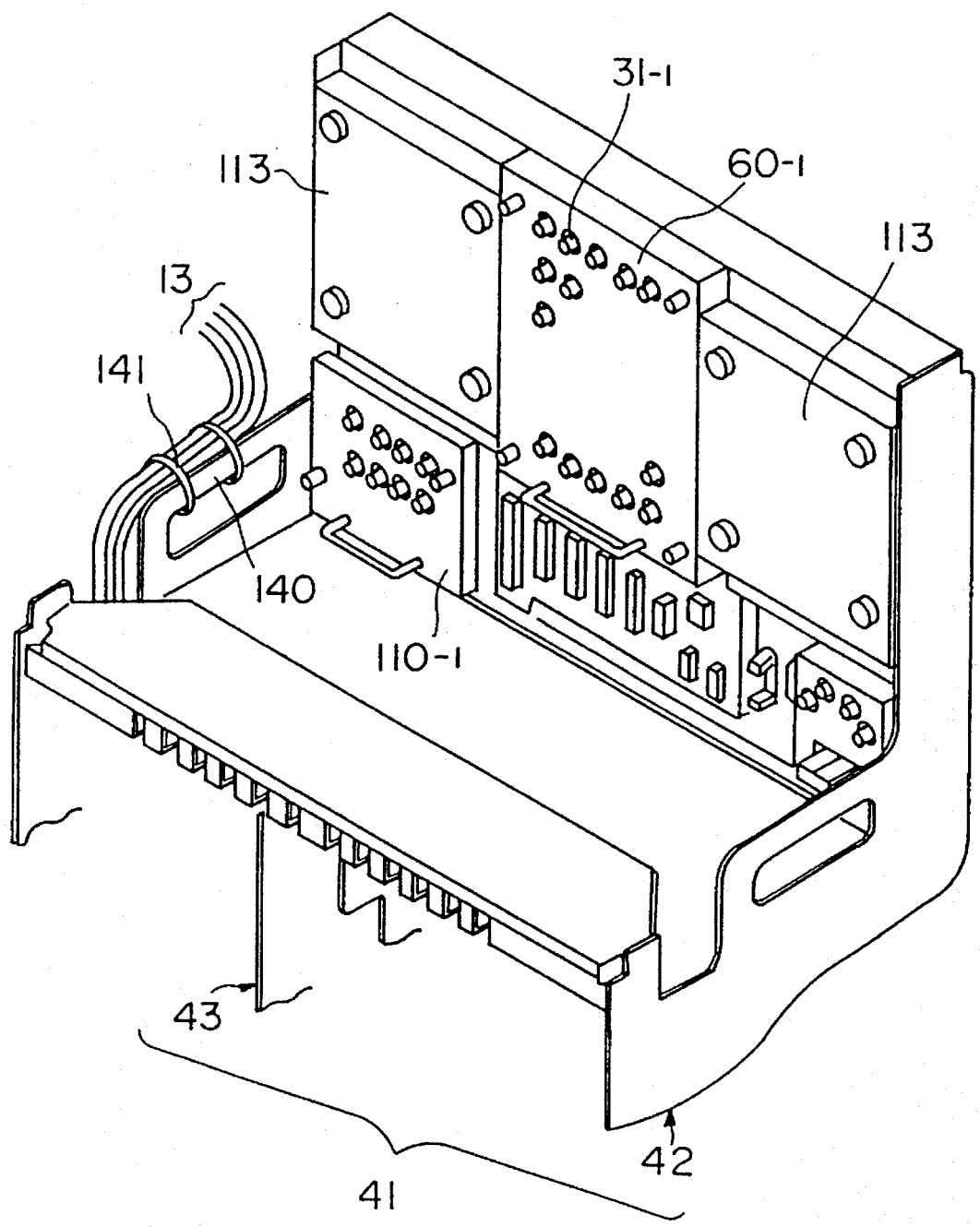
FIG. 10 is a perspective view showing the subrack device.

(1) The subrack device $40_{-1}$ applicable for the communication system $10_{-1}$ The subrack device $40_{-1}$ comprises the subrack body 42, the circuit-board-unit 43, the outer-connecting-board $60_{-1}$, the outer-connecting-board $110_{-1}$ and the blank block 113. As shown in FIG. 10, the subrack body 42 constitutes the subrack device. A plurality of circuit-board-units 43 are mounted in the circuit-board-unit housing portion 46 of the subrack body 42. The outer-connecting-board 601 is plugged in and secured by screws in the outer-connecting-board mounting territory $120_{-2}$ of the outer-connecting-board mounting portion 47 of the subrack body 42. The outer-connecting-board connecting-board $110_{-1}$ is plugged in and secured by screws in the outer-connecting-board mounting territory $120_{-4}$. In the outer-connecting-board mounting territories $120_{-1}$, $120_{-3}$, the blank block 113 is provided. The subrack device $40_{-1}$ has the electrical connection shown in FIG. 6.

(2) The subrack device $40_{-2}$ applicable for the communication system 102

The subrack device $40_{-2}$ comprises the subrack body 42, the circuit-board-unit 43, the outer-connecting-board $60_{-2}$, the outer-connecting-board $110_{-2}$ and the blank block 113.

Figure 11:
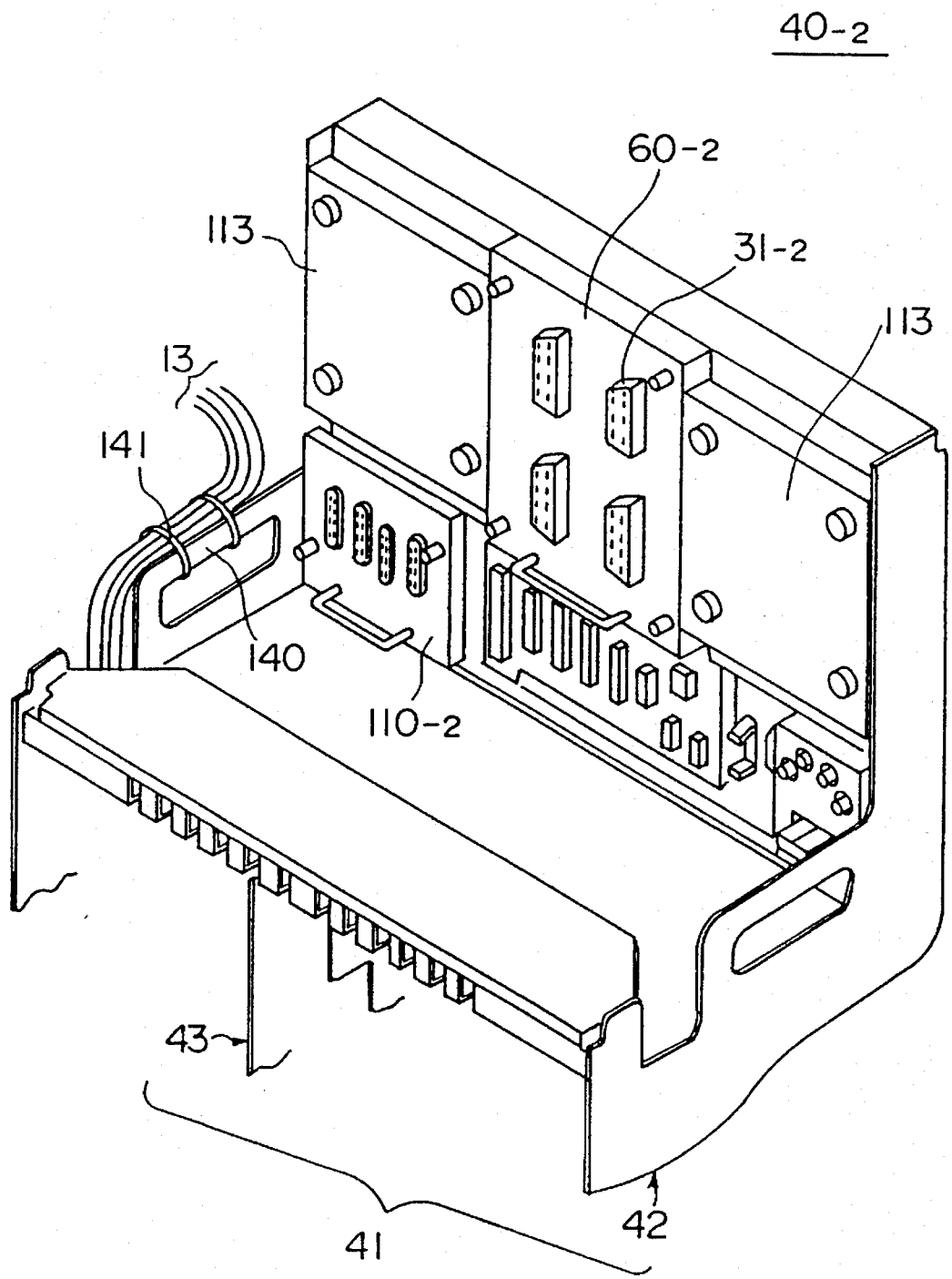
FIG. 11 is another perspective view showing the subrack device.

As shown in FIG. 11, the subrack body 42 constitutes the subrack device. A plurality of circuit-board-units 43 are mounted in the circuit-board-unit housing portion 46 of the subrack body 42. The outer-connecting-board $60_{-2}$ is plugged in and secured by screws in the outer-connecting-board mounting territory $120_{-2}$ of the outer-connecting-board mounting portion 47 of the subrack body 42. The outer-connecting-board $110_{-2}$ is plugged in and secured by screws in the outer-connecting-board mounting territory $120_{-4}$. In the outer-connecting-board-connecting-portion mounting territories $120_{-1}$, $120_{-3}$, the blank block 113 is provided. The subrack device $40_{-1}$ has the electrical connection shown in FIG. 7. In the above two subrack devices $40_{-1}$, $40_{-2}$, the subrack body 42 and the circuit-board-unit 43 constitute the common structure 41.

(3) The subrack device $40_{-5}$ applicable for the communication system $10_{-5}$ The subrack device $40_{-5}$ comprises the subrack body 42, the circuit-board-unit 43, the outer-connecting-board 111, the outer-connecting-board $110_{-1}$ and the coaxial cable 112.

Figure 12:
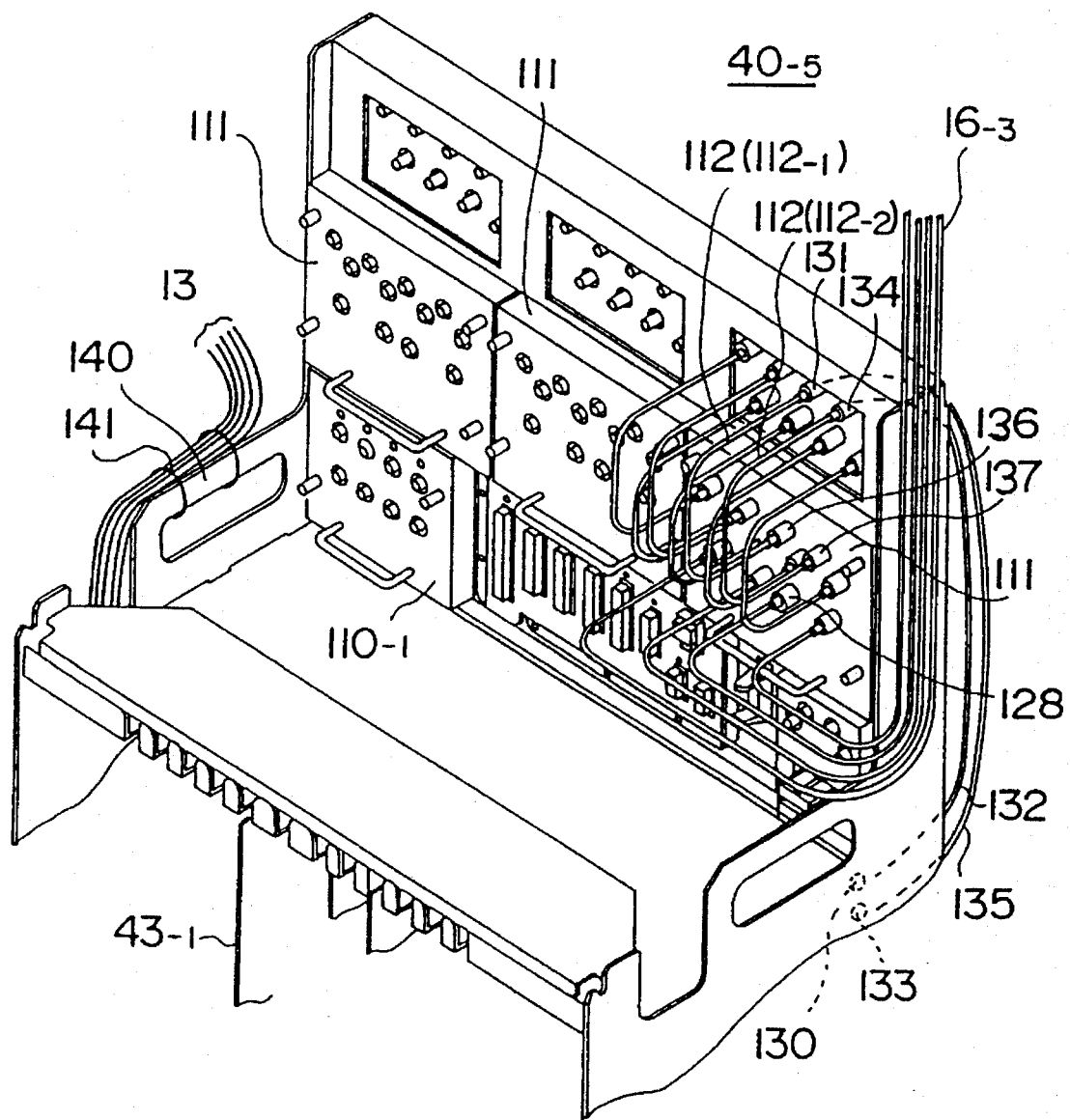
FIG. 12 is a perspective view showing a subrack device applicable for a communication system.

Since the fundamental bit rate of the non-synchronizing hierarchy network device is 34 Mbps, which is high, the coaxial cable is used instead of an electric wire in order to transmit signals at a higher bit rate. As shown in FIG. 12, the subrack body 42 constitutes the subrack device. A plurality of the circuit-board-units $43_{-1}$ are mounted in the circuit-board-unit housing portion 46 of the subrack body 42. The outer-connecting-board 111 is plugged in and secured by screws in the lower portion of the outer-connecting-board mounting territories $120_{-1}$, $120_{-2}$, $120_{-3}$ in the outer-connecting-board mounting portion 47 of the subrack body 42.

Figure 13:
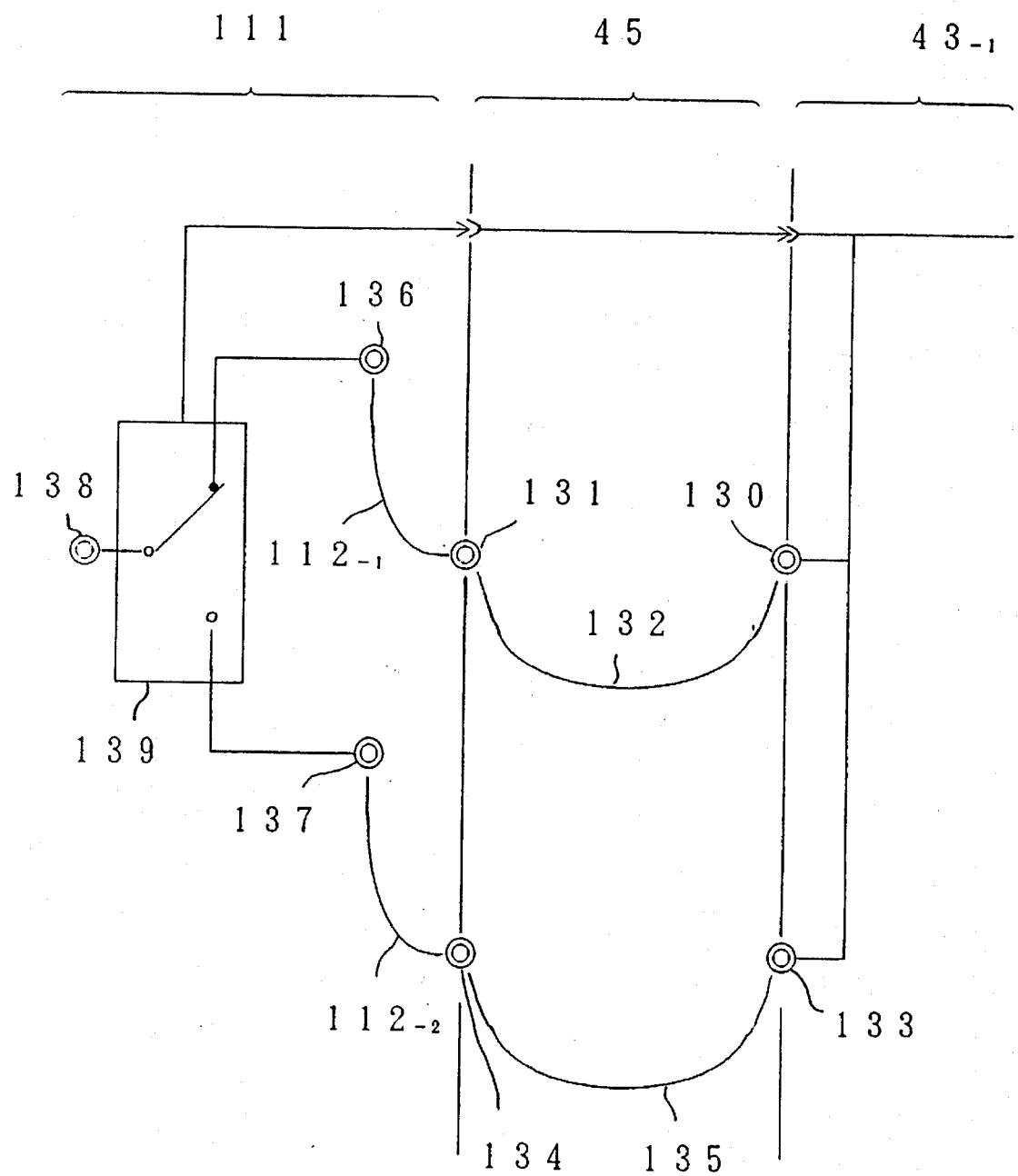
FIG. 13 is a circuit diagram showing an electrical connection of the subrack device shown in FIG. 12.

The outer-connecting-board $110_{-1}$ is plugged in and secured by screws in the outer-connecting-board-connecting-portion mounting territory $120_{-4}$. One end of the U-shaped coaxial cable 112 is connected to the outer-connecting-board connecting-board 111 and the other end thereof is connected to the subrack body 42. The subrack device $40_{-5}$ has an electrical connection shown in FIG. 13. The BWB assembly 45 is electrically connected to the circuit-board-unit $43_{-1}$ and to the outer connecting board 111. In the BWB assembly 45, a coaxial cable 132 actually used is provided between connection terminals 130, 131. A standby coaxial cable 135 is provided between connection terminals 133, 134. The outer-connecting-board 111 has input connection terminals 136, 137 and an outer connecting terminal 138. A relay 139 is provided between input connection terminals 136, 137 and the outer connection terminal 138. When an accident occurs, the relay 139 is operated to switch the present route (coaxial cable 132 →$112_{-1}$) to the backup route (coaxial cable 135 →$112_{-2}$).

(4) The subrack device applicable for other communication systems.

This type of subrack device is also produced using a subrack body 42.

As is understood from the above description, when the subrack devices are produced applicable for each communication system, the subrack body 42 is used commonly. That is, the subrack body 42, which is a main part of the subrack device, is standardized. Also, each outer-connecting-board can be plugged therein. Thus, the subrack device applicable for each communication system can be produced flexibly and economically.

The subrack device $40_{-1}$ is installed in, for example, the telephone station $11_{-1}$ having the non-synchronizing hierarchy network device$17_{-1}$ shown in FIG. 1 to be operated. In this case, the optical-fibers 13 are connected to the circuit-board-unit 43. The connector (not shown) provided at the end of the electric wire $16_{-1}$ led from the non-synchronizing hierarchy network device$17_{-1}$ is connected to the outer connector $31_{-1}$.

The subrack device $40_{-2}$ shown in FIG. 11 is installed in, for example, a telephone station $11_{-2}$ having the non-synchronizing hierarchy network device$17_{-2}$ to be operated. In this case, the optical-fibers 13 are connected to the circuit-board-unit 43. The connector (not shown) provided at the end of the electric wire $16_{-2}$ led from the non-synchronizing hierarchy network device$17_{-2}$ is connected to the outer connector $31_{-2}$.

The subrack device $40_{-5}$ shown in FIG. 12 is installed in the telephone station $11_{-3}$ having the non-syncronizing hierarchy network device$17_{-3}$ in which the fundamental bit rate is 34 Mbps. In this case, the optical-fibers 13 are connected to the circuit-board-unit $43_{-1}$. The connector provided at the end of the coaxial cable $16_{-3}$ led from the non-synchronizing hierarchy network device$17_{-3}$ is connected to the outer connector 138.

In the above subrack devices $40_{-1}$, $40_{-2}$, $40_{-3}$, the optical-fibers 13 are tied to a handle 140 formed in the chassis assembly 44 by wires 141.

Hereinafter, parts constituting the above subrack devices $40_{-1}$, $40_{-2}$ will now be described.

Figure 14:
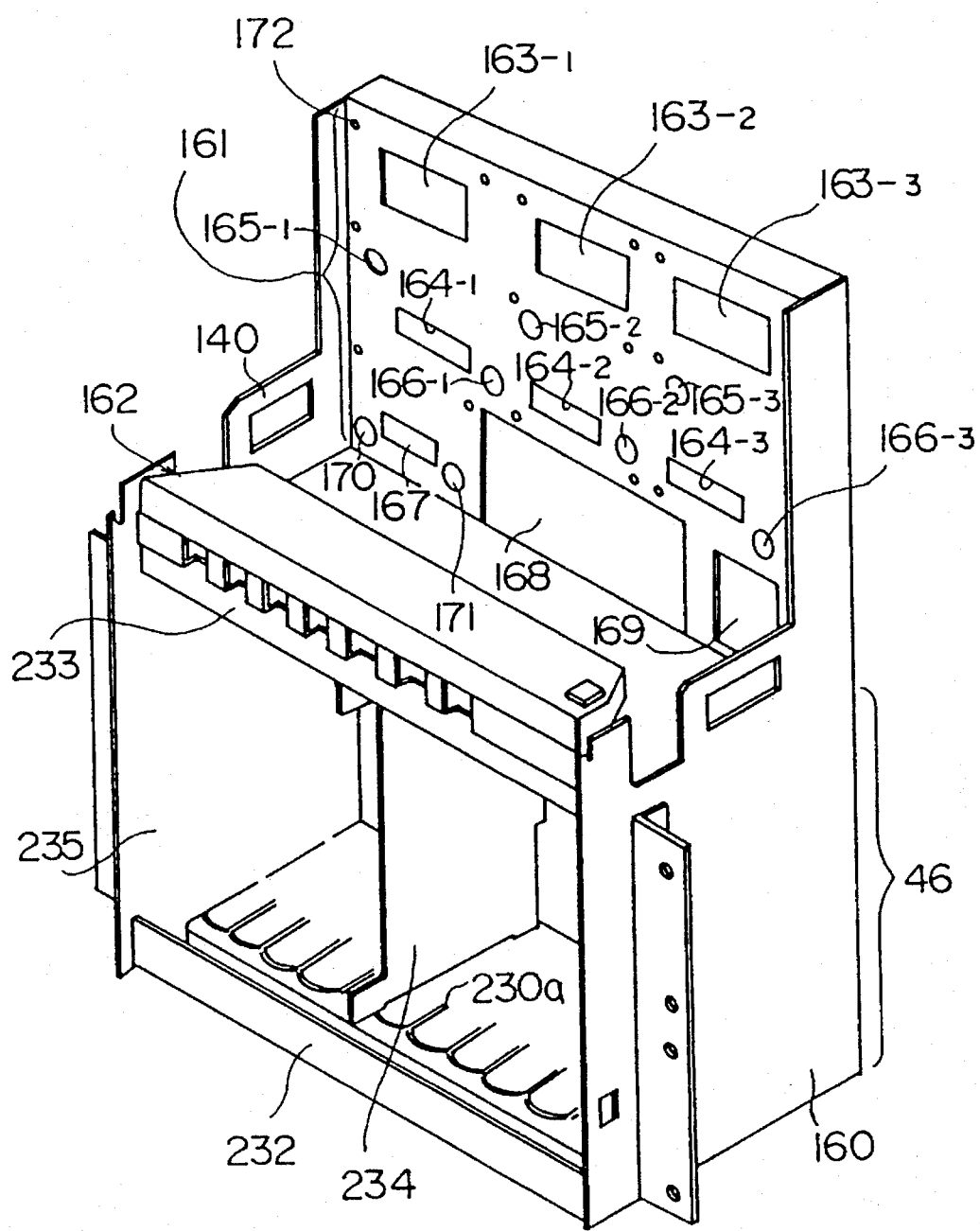
FIG. 14 Is a perspective view showing a chassis assembly.
Figure 15:
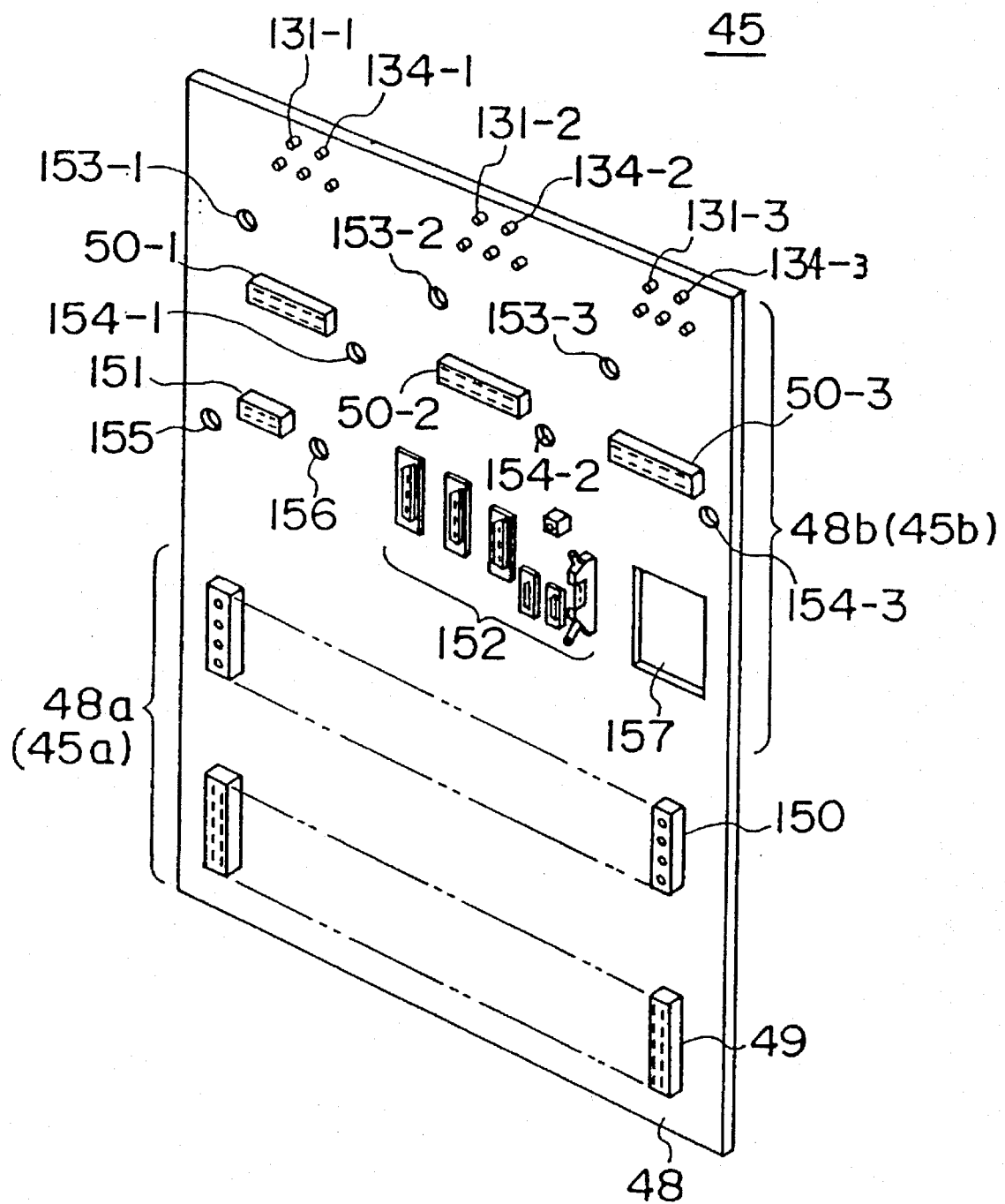
FIG. 15 is a perspective view showing a BWB assembly.

II-4 Subrack Body 42 (Cf. FIGS. 8, 14 and 15)

In the subrack body 42, the BWB assembly 45 shown in FIG. 15 is provided at the rear face of the chassis body 44 shown in FIG. 14. In the subrack body 42, the circuit-board-unit housing portion 46 is provided in the lower half and the outer-connecting-board mounting portion 47 is provided in the top half, as shown in FIG. 8.

(1) The BWB assembly 45

In the BWB assembly 45, circuit board connectors 49 and outer connectors 50 are provided in the BWB 48, as shown in FIG. 15. In the bottom half 48a of the BWB 48, circuit-board-unit connectors 150, 49 are arranged in two lines. In the top half 48b of the BWB 48, connection terminals $131_{-1}$–$131_{-3}$ are provided in the upper part, outer connector $50_{-1}$, $50_{-2}$, $50_{-3}$ are provided in the middle, and an outer-connecting-board connector 151 and a group of common-connecting-portion connectors 152 are provided in the lower part. All of the above connectors 49, $50_{-1}$–$50_{-3}$, 150, 151, 152 and connection terminals $131_{-1}$–$131_{-3}$, $134_{-1}$–$134_{-3}$ are press-fit parts and are secured in the BWB by press-fitting. In the BWB 48, positioning holes $153_{-1}$–$153_{-3}$, $154_{-1}$–$154_{-3}$, 155, 156 are formed for connectors $50_{-1}$, $50_{-2}$, $50_{-3}$, 151. Observing the BWB from the front, the positioning hole $153_{-1}$ is formed diagonally up to the left of the connector $50_{-1}$ and the positioning hole $154_{-1}$ is formed diagonally down to the right of the connector $50_{-1}$. The relative position of the positioning holes $153_{-2}$, $154_{-2}$ to the connector $50_{-2}$ and the relative position of the positioning holes $153_{-3}$, $154_{-3}$ to the connector $50_{-3}$ are the same as that of the positioning holes $153_{-1}$, $154_{-1}$ to the connector $50_{-1}$. The positioning holes 155, 156 are formed on both sides of the connector 151. In the BWB 48, an opening 157 of a rectangular shape is formed in the right side of the above common-connecting-portion connectors 152 for introducing cables.

(2) Chassis assembly 44

The chassis assembly 44, as shown in FIG. 14, has side plates 160 on both sides, the box-shaped circuit-board-unit housing portion 46 in the lower half, and a vertical wall plate 161 at the rear side of the circuit-board-unit housing portion 46. In the upper part of the circuit-board-unit housing portion 46, an optical-fiber handling portion 162 which handles an excess length of the optical-fibers is provided in the front side.

The vertical wall plate 161 has a plurality of openings corresponding to the upper part of the BWB assembly 45 shown in FIG. 15. In the upper part of the vertical wall plate 161, openings $163_{-1}$, $163_{-2}$, $163_{-3}$ of a rectangular shape are formed for the connection terminals 131, 134. In the middle, openings $164_{-1}$, $164_{-2}$, $164_{-3}$ of a rectangular shape are formed for the outer-connecting-board connector 50. The relative position of positioning holes $165_{-1}$–$165_{-3}$, $166_{-1}$–$166_{-3}$ to the openings $164_{-1}$–$164_{-3}$ is the same as that of the positioning holes $153_{-1}$–$153_{-3}$, $154_{-1}$–$154_{-3}$ to each of the connectors $50_{-1}$–$50_{-3}$. In the lower portion, a rectangular opening 167 for the outer-connecting-board connector and openings 168, 169 for the common-connecting board connectors 152 are formed. The relative position of the two positioning holes 170, 171 to the opening 167 is the same as that of the positioning holes 155, 156 to the connector 151 of the BWB assembly 45. In the vertical wall plate 161, a plurality of screw holes 172 are formed. When the BWB assembly 45 is fixed to the rear side of the chassis assembly 44, the circuit-board-unit housing portion 46 and outer-connecting-board mounting portion 47 are formed in a way to be described later.

(a) The circuit-board-unit housing portion 46

A lower-half portion 45a of the BWB assembly 45 covers the rear side of the circuit-board-unit housing portion 46. The connectors 150, 49 are arranged in the circuit-board-unit housing portion 46.

(b) The outer-connecting-board mounting portion 47

An upper-half portion 45b of the BWB assembly 45 faces the rear face of the vertical wall plate 161.

Figure 20:
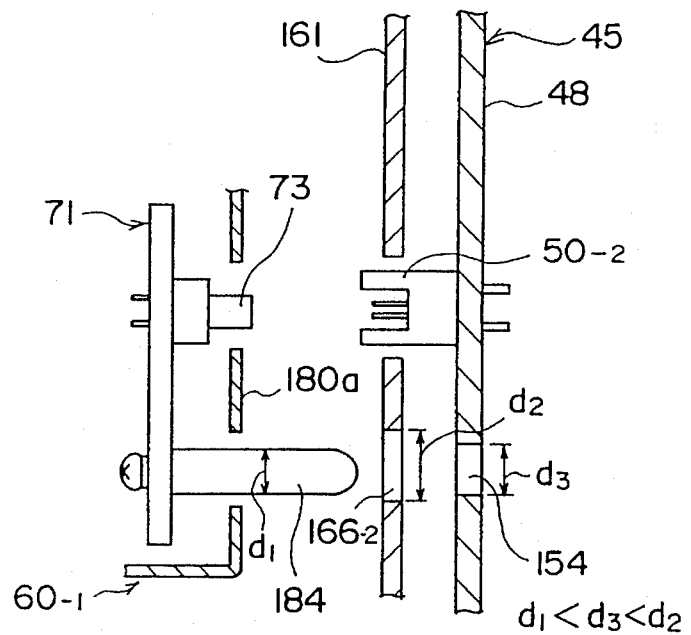
FIG. 20 is a schematic illustration showing a positioning of the outer-connecting-board.

As shown in FIG. 8, the connecting terminals $131_{-1}$, $134_{-1}$, $131_{-2}$, $134_{-2}$, $131_{-3}$, $134_{-3}$ are exposed from the openings $163_{-1}$, $163_{-2}$, 1633. The connectors $50_{-1}$, $50_{-2}$, $50_{-3}$ protrude from the openings $164_{-1}$, $164_{-2}$, $164_{-3}$ respectively. The positioning holes $165_{-1}$–$165_{-3}$, $166_{-1}$–$166_{-3}$ face the positioning holes $153_{-1}$–$153_{-3}$, $154_{-1}$–$154_{-3}$ (Cf. FIG. 20). The connector 151 protrudes from the opening 167. The positioning holes 170, 171 face the positioning holes 155, 156. The common-connecting-portion connectors 152 are exposed from the opening 168. The connecting terminals $131_{-1}$, $134_{-1}$, the connector $50_{-1}$ and the positioning holes $165_{-1}$, $166_{-1}$ are provided in the outer-connecting-board mounting territory $120_{-1}$ shown in FIG. 9. The connecting terminals $131_{-2}$, $134_{-2}$, the connector $50_{-2}$ and the positioning holes $165_{-2}$, $166_{-2}$ are provided in the outer-connecting-board mounting territory $120_{-2}$ shown in FIG. 9. The connecting terminals $131_{-3}$, $134_{-3}$, the connector $50_{-3}$ and the positioning holes $165_{-3}$, $166_{-3}$ are provided in the outer-connecting-portion mounting territory $120_{-3}$ shown in FIG. 9. The outer-connecting-board connector 151 and the positioning holes 170, 171 are formed in the outer-connecting-board mounting territory $120_{-4}$ shown in FIG. 9. The common-connecting-portion connectors 152 are provided in the outer-connecting-board mounting territory $120_{-5}$ shown in FIG. 9.

II-5 Outer Connection Board $60_{-1}$ (FIGS. 8, 16, 17, 18 and 19)

In the outer-connecting-board $60_{-1}$, the circuit board assembly 71 is provided in the shield box 182 of a rectangular shape in which a box body 180 and a lid 181, which are made of metal, are combined.

Figure 16:
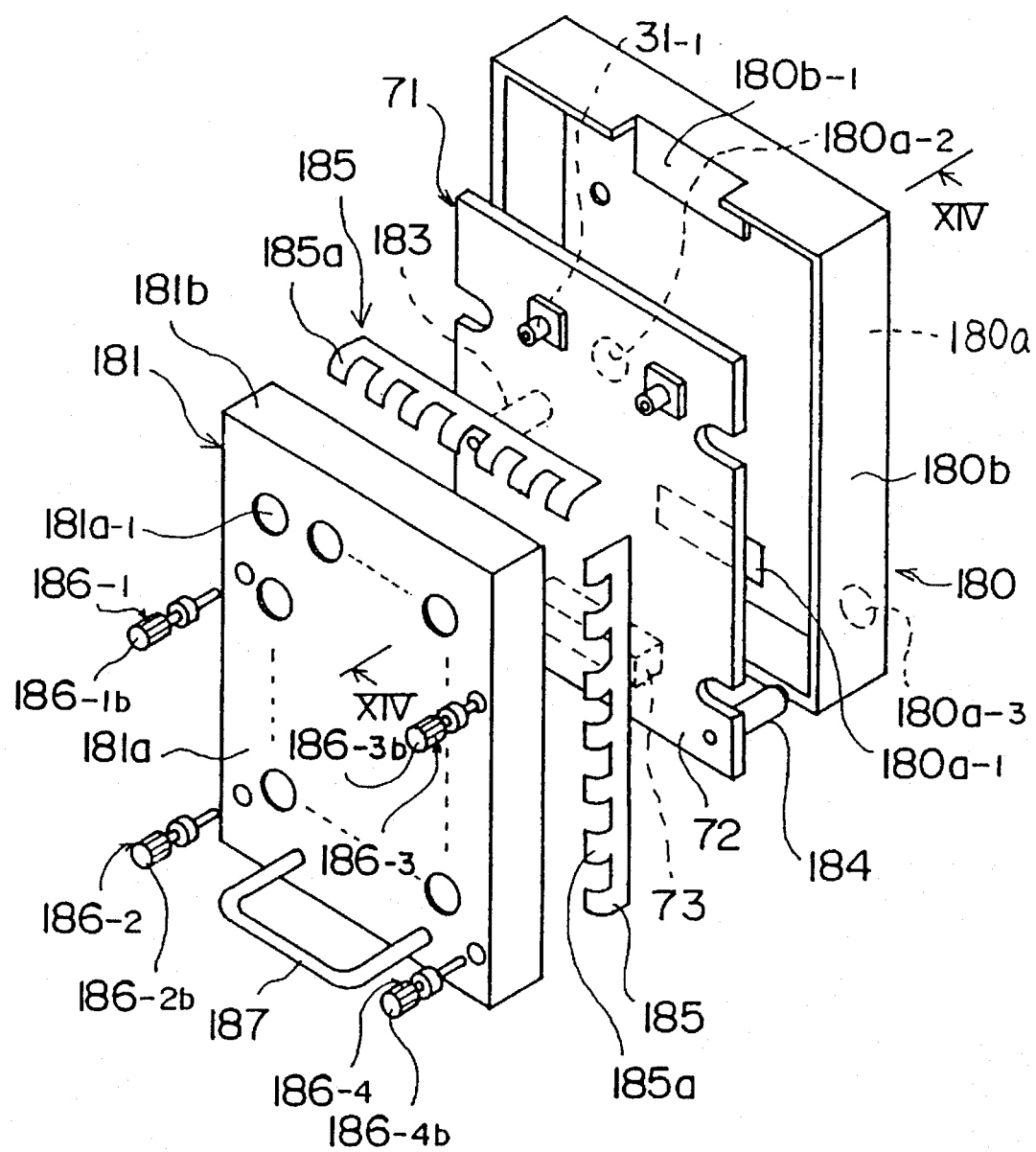
FIG. 16 is a perspective fabrication view showing an outer-connecting-board.
Figure 19:
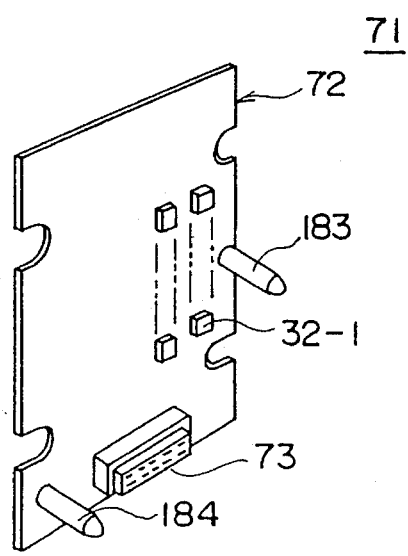
FIG. 19 is a perspective view showing a backside of the circuit board assembly shown in FIG. 16.

The circuit board assembly 71 comprises the circuit board 72, a plurality of the outer connectors $31_{-1}$, the impedance conversion transformer $32_{-1}$ of 75Ω, the connector 73 and two positioning pins 183, 184, as shown in FIGS. 16 and 19. The outer connector $31_{-1}$ is arranged in the surface of the circuit board 72 in a matrix formation. The impedance conversion transformer $31_{-1}$ is provided in the rear surface of the circuit board 72 corresponding to each outer connector $31_{-1}$. The connectors 73 are mounted in the lower part of the rear surface of the circuit board 72. The above outer connector $31_{-1}$, the impedance conversion transformer $32_{-1}$ and the connectors 73 are mounted in the circuit board 72 by soldering. The positioning pins 183, 184 have a cylindrical shape and are secured in the circuit board 72 by screws. The positioning pins 183, 184 protrude to the rear face of the circuit board 72. The relative position of the positioning pins 183, 184 to the connector 73 is the same as that of the positioning holes $153_{-1}$, $154_{-1}$ to the connector $50_{-1}$ shown in FIG. 15. The tip end of the positioning pins 183, 184 is tapered or spherical to be inserted easily. The box body 180 has a flat bottom plate 180a and a side-plate portion 180b of a square-frame shape. In the bottom plate portion 180a, an opening $180a_{-1}$ for the connector 73 and openings $180a_{-2}$, $180a_{31\ 3}$ for the positioning pins 183, 184 are formed. In the side-plate portion 180b, a seat portion $180b_{-1}$ on which the circuit board assembly 71 is secured is formed. A lid 181 has a lid-plate portion 181a and a side-plate portion 181b of a square frame shape. The lid-plate portion 181a has a plurality of holes $181a_{-1}$ formed in the same formation as that of the outer connectors $31_{-1}$.

Figure 17:
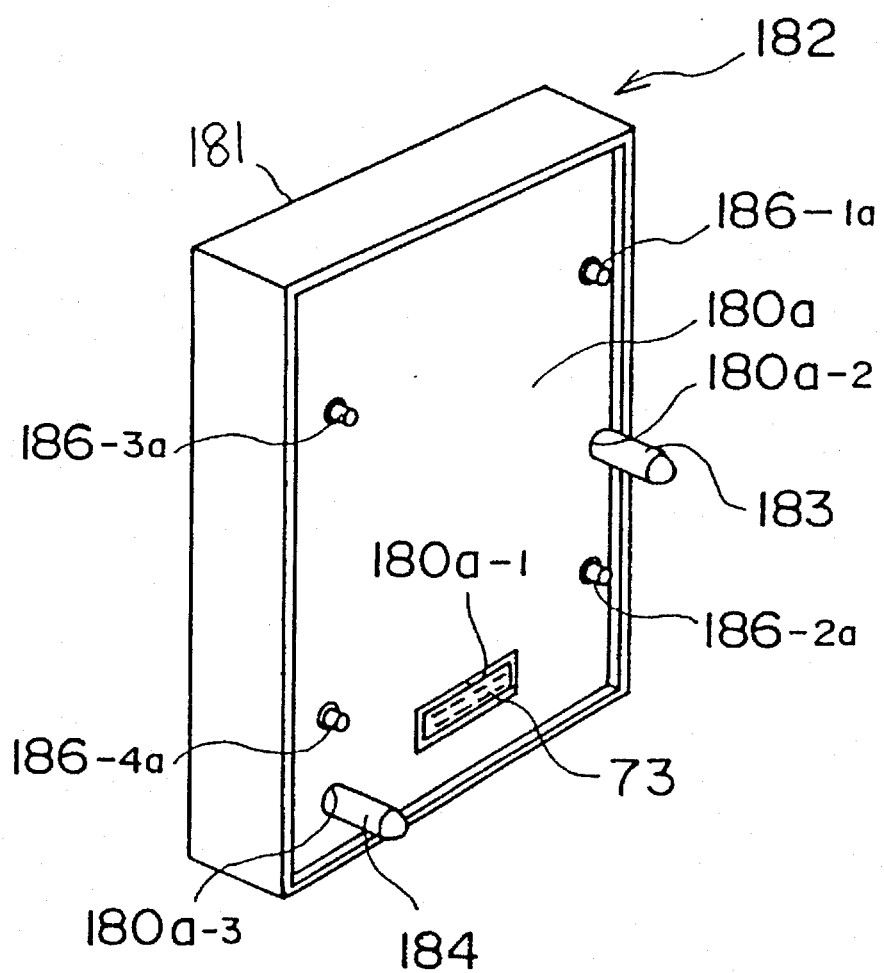
FIG. 17 is a rear and perspective view showing the outer-connecting-board shown in FIG. 16.
Figure 18:
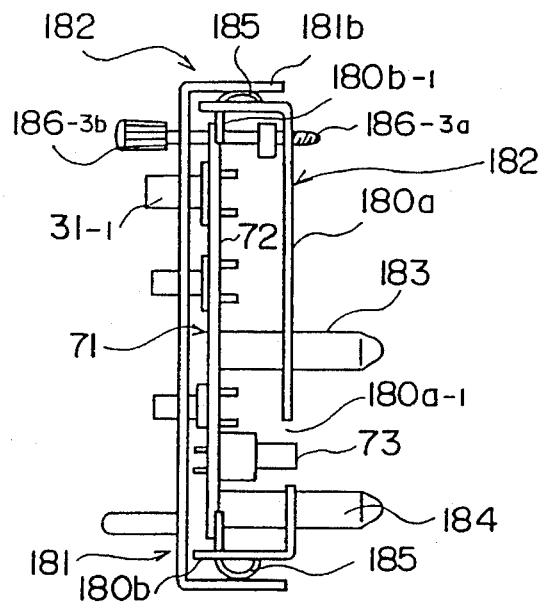
FIG. 18 is a sectional view showing the outer connecting board.

The circuit board assembly 71 is, as shown in FIG. 18, fixed in the box body 180 by the circuit board 72 being secured in the seat portion $180b_{-1}$. The circuit board assembly 71 is accommodated in the box body 180. As shown in FIG. 17, the connectors 73 are exposed from the opening $180a_{-1}$. The positioning pins 183, 184 protrude from the rear face of the outer-connecting-board $61_{-1}$ through the openings $180a_{-2}$, $180a_{-3}$.

A side-plate portion 181b of the lid 181 is engaged with outside of the side-plate portion 180b of the box body. Between the side-plate portions 181b along four sides, electromagnetic noise shield gaskets 185 which have a plurality of springs 185 are provided. That is, the outer-connecting-board $60_{-1}$ has an anti-electromagnetic noise mechanism. The outer-connecting-board $60_{-1}$ has four screws $186_{-1}$–$186_{-4}$ and a handle 187. The screws $186_{-1}$–$186_{-4}$ have a bar shape which has thread portions $186_{-1a}$–$186_{-4a}$ at one end and nob portions $186_{-1b}$–$186_{-4b}$ at the other end. The screws $186_{-1}$–$186_{-4}$ protrude from the box 182 at a left-upper point and a left-lower point. The thread portions $186_{-1a}$–$186_{-4a}$ protrude from the rear face of the box 182 and the nob portions $186_{-1b}$–$186_{-4b}$ protrude from the front face of the box 182.

II-6 Mounting Outer Connection Board $60_{-1}$

The outer-connecting-board $60_{-1}$ is provided in a desired mounting territory by the following steps.

(1) Place the outer-connecting-board $60_{-1}$ in the desired outer-connecting-portion mounting territory $120_{-2}$.

(2) The positioning pins 183, 184 and the positioning holes $165_{-2}$, $166_{-2}$ are mated. The outer-connecting-board 60–1 is urged to the outer connecting mounting portion 47.

(3) The screws $186_{-1}$–$186_{-4}$ are tightened.

As shown in FIG. 20, a diameter $d_1$ of the positioning pin 184, a diameter $d_2$ of the positioning hole $166_{-2}$ formed in the vertical wall plate 161 of the chassis assembly 44 and a diameter $d_3$ of the positioning hole $154_{-2}$ formed in the BWB 48 have the following relationship.

$$d_1 < d_3 < d_2$$

Thus, the positioning pin 184 is inserted easily into the hole $166_{-2}$ in the first step and is engaged with the hole $154_{-2}$ in the second step. The other positioning pin 183 is inserted easily into the hole $165_{-2}$ and is engaged with the hole $153_{-2}$. Thus, the outer-connecting-board $60_{-1}$ is roughly positioned in the above first step and accurately positioned in the second step to connect the connector 73 to the connector $50_{-2}$ smoothly and properly.

Figure 21:
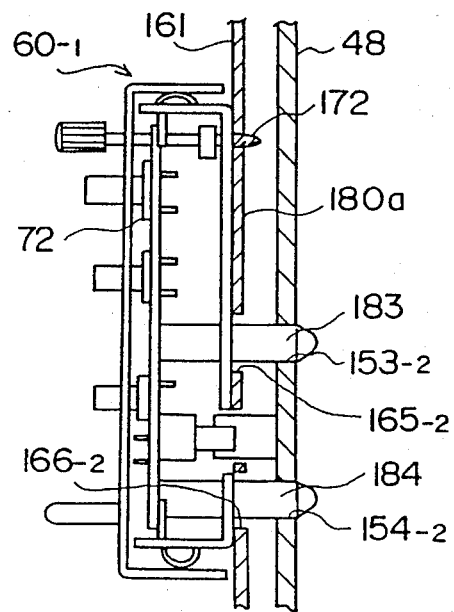
FIG. 21 is a schematic illustration showing the outer-connecting-board.

When the screws are tightened securely, a whole surface of the bottom portion 180a contacts the vertical wall plate 161, as shown in FIG. 21. Thus, the outer-connecting-board $60_{-1}$ contacts the chassis assembly over a large area and is grounded securely. As described above, since the outer-connecting-board $60_{-1}$ has a shield box structure and is grounded by connecting to the chassis assembly 44, a radiation of the electromagnetic noise from the outer-connecting-board $60_{-1}$ is repressed when operated. The above outer-connecting-boards $60_{-1}$ are mounted in the other connecting portion mounting territories $120_{-1}$, $120_{-2}$.

When the outer-connecting-board $60_{-1}$ is mounted in the mounting territory, the circuit board assembly 71 (circuit board 72) is parallel to the BWB 48 (BWB assembly 45). That is, the outer-connecting-board $61_{-1}$ faces the outer-connecting-board mounting portion 47. Thus, territories in which an outer cable connected to the outer connector $31_{-1}$ is provided can be formed efficiently. That is, when the outer-connecting-board $60_{-1}$ is provided vertically in the mounting portion 47, a dead space in which the outer cable cannot be provided is formed.

II-7 Structure and Mounting of other Outer
Connection Boards $60_{-2}$, $110_{-1}$, $110_{-2}$, 111

The outer-connecting-boards $60_{-2}$ have the same structure as the above outer-connecting-board $60_{-1}$ except the outer connector $31_{-2}$ and an impedance conversion transformer of 120Ω (not shown), as shown in FIG. 11.

The outer-connecting-board $60_{-2}$ is fixed in the outer-connecting-portion mounting territories $120_{-1}$, $120_{-2}$, $120_{-3}$ as well as the above outer-connecting-board $60_{-1}$. As shown in FIG. 8, outer-connecting-boards $100_{-1}$, $100_{-2}$ have substantially the same structure as the above outer-connecting-board $60_{-1}$. As shown in FIGS. 9, 10 and 11, the outer-connecting-boards $100_{-1}$, $100_{-2}$ are secured in the outer-connecting-portion mounting territory $120_{-4}$ in the following way. The positioning pins 190, 191 are inserted into the positioning holes 170, 155, and 171, 156. After that, the positioning pins 190, 191 are connected to the connector 151 and are secured by screws. As shown in FIG. 8, the outer-connecting-board 111 has a size half of the above outer-connecting-board $60_{-1}$ and has substantially the same structure as the outer-connecting-board $60_{-1}$. The outer-connecting-board 111 is, as shown in FIG. 12, positioned by the positioning pins and positioning holes. The outer-connecting-board 111 is connected and secured to the connector $50_{-1}$ by screws to be fixed in the lower-half portion of the outer-connecting-portion mounting territories $120_{-1}$, $120_{-2}$, $120_{-3}$.

Figure 6:
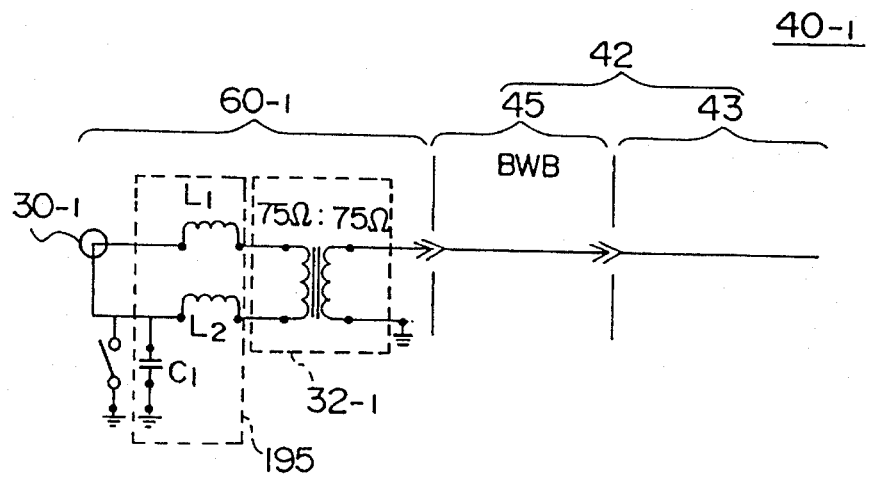
FIG. 6 is a circuit diagram showing an electrical connection between a BWB of the subrack device shown in FIG. 5 and an outer connecting assembly.

II-8 Electrical Circuit of Outer Connection
Boards $60_{-1}$, $60_{-2}$ (1) The outer-connecting-board $60_{-1}$ (FIGS. 6, 16 and 19)

The circuit board assembly 71 shown in FIGS. 16 and 19 has a 75Ω impedance conversion transformer $32_{-1}$ and a filtering circuit 195.

Mismatch loss characteristics are prevented from being deteriorated by the 75Ω impedance conversion transformer $32_{-1}$. Also, only one wiring is required between the outer-connecting-board $60_{-1}$ and BWB assembly 45 per one channel.

The filtering circuit 195 is provided between the impedance conversion transformer 321 and the outer connector $31_{-1}$. In the filtering circuit 195, coils $L_1$, $L_2$ and a capacitor $C_1$ are connected in a way as shown in FIG. 6. Since the filtering circuit 195 is provided, a noise level, which is generated in the subrack, is transmitted through the outer-connecting-board $61_{-1}$ and a leak from the outer connector $31_{-1}$ to the outside of the subrack device $40_{-1}$ can be reduced effectively.

Figure 7:
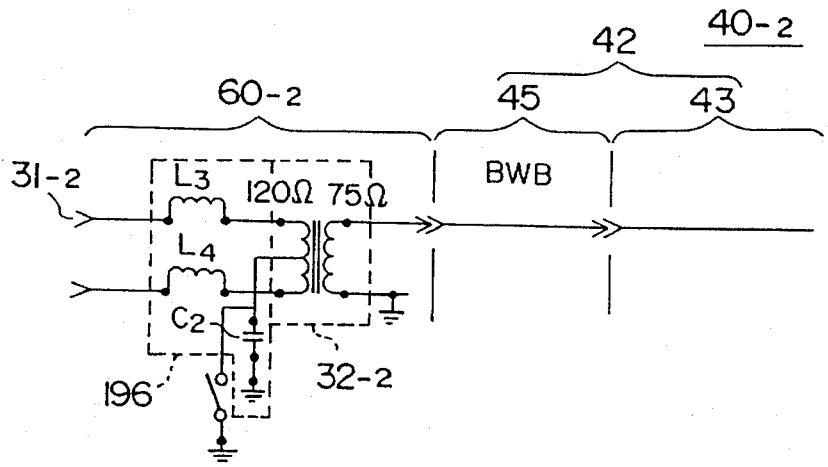
FIG. 7 is another circuit diagram showing an electrical connection between a BWB of the subrack device shown in FIG. 5 and an outer connecting assembly.

(2) The outer-connecting-board $60_{-2}$ (FIG. 7)

The outer-connecting-board $60_{-2}$ has, as shown in FIG. 7, a 120Ω impedance conversion transformer $32_{-2}$ and a filtering circuit 196.

The filtering circuit 196 comprises coils $L_3$, $L_4$ and a capacitor $C_{-2}$.

The impedance conversion transformer $32_{-2}$ functions in the same way as the impedance conversion transformer $32_{-1}$ of the outer-connecting-board $60_{-1}$. The filtering circuit 196 functions in the same way as the filtering circuit 195 of the outer-connecting-board $60_{-1}$.

II-9 Structure of Power Source Receiving Territory $120_{-6}$

As shown in FIG. 22, a power-source receiving portion 200 has a circuit board assembly 201, which is separated from the BWB 48.

Figure 23:
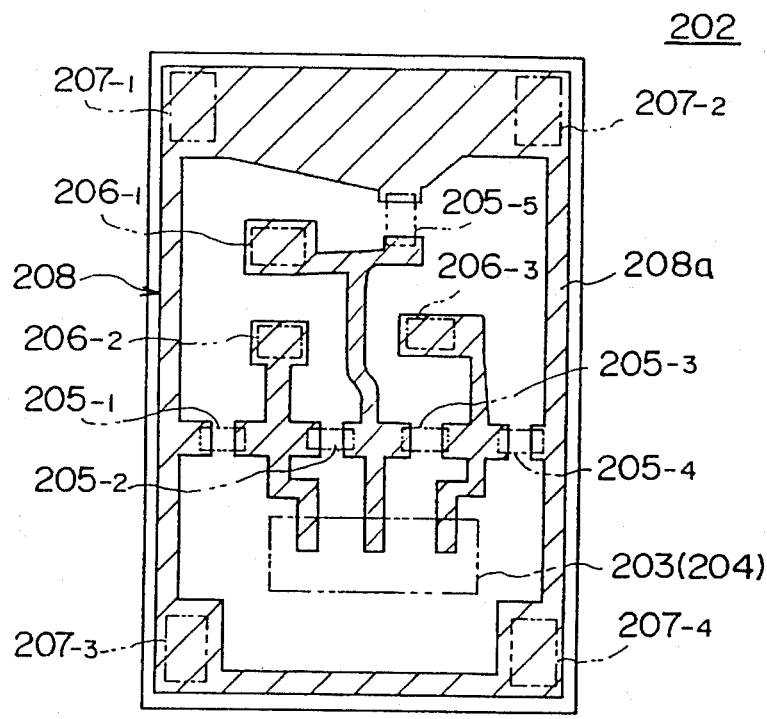
FIG. 23 is a plan view showing a circuit board shown in FIG. 22.

The circuit board assembly 201 comprises a circuit board 202 shown in FIG. 23, power-source connectors 203, 204 mounted thereon, capacitor chips $205_{-1}$–$205_{-5}$ mounted thereon, load terminals $206_{-1}$–$206_{-3}$ and grounding terminals $207_{-1}$–$207_{-4}$ serving as securing/connecting means.

Figure 24:
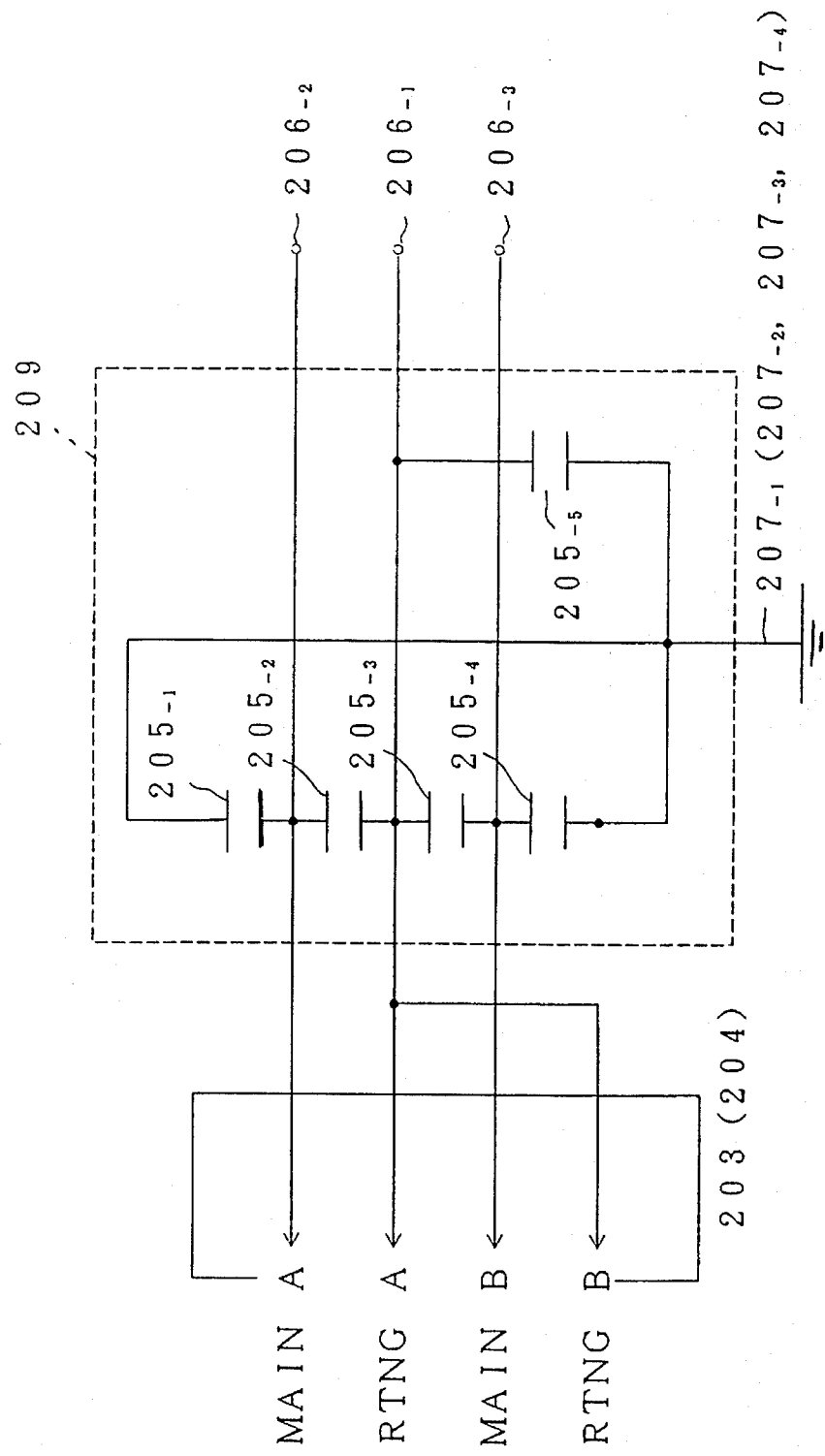
FIG. 24 is a circuit diagram showing an power-source accepting portion.

The circuit board 202 has a wiring pattern 208 shown in FIG. 23. The capacitor chips $205_{-1}$–$205_{-5}$ mounted in the circuit board 202 are shown as a tow-dotted chain line in FIG. 23. The capacitor chips $205_{-1}$–$205_{-5}$ are electrically connected in a way as shown in FIG. 24 to constitute a filtering circuit 209. The filtering circuit 209 functions to reduce a noise level which leaks from the subrack device $40_{-1}$ through the power-source receiving portion 200 to the power-source cable.

The wiring pattern 208 has a frame pattern portion 208a along a periphery of the circuit board 202. At each corner of the frame pattern portion 208a, grounding terminals $207_{-1}$–$207_{-4}$ are secured by soldering. Each grounding terminal $207_{-1}$ ($207_{-2}$–$207_{-4}$) is a metal part of a bent shape which has a screw hole $207_{-1a}$ and foot portions $207_{-1b}$. Each grounding terminal $207_{-1}$ ($207_{-2}$–$207_{-4}$) is secured at each corner of the circuit board 202 by the foot portions 207–1b being solder-joined and thus being electrically connected to the wiring pattern 208. The grounding terminals $207_{-1}$–$207_{-4}$ of the circuit board assembly 201 are secured at positions adjacent to the openings 169 of the vertical wall plate 161 by screws 211. One end of the electrical wire 212 is connected to the load terminals $206_{-1}$ ($206_{-2}$, $206_{-3}$). The electrical wire 212 is introduced through the opening 157 and is connected to the terminals 213 on the BWB 48. The circuit board assembly 201 is covered with a cover member 214 made of metal with the power-source connector 203, 204 being exposed. The power-source connectors 203, 204 are connected to connectors 217, 218 of the power-source cable 215, 216 in the telephone station.

Next, a connecting portion between the above filtering circuit 209 and the frame ground will be described. The filtering circuit 209 is connected to the frame ground at a plurality of, for example four, positions. Thus, the filtering circuit 209 can reduce the leaking noise level effectively compared with that connected at one position. Therefore, a noise level leaking from the subrack device $40_{-1}$ to the power-source cable 215, 216 through the power-source receiving portion 200 can be reduced according to the present embodiment. The electrical connections between the filtering circuit 209 and the frame ground at four points are made by the grounding terminal members $207_{-1}$–$207_{-4}$ which secure mechanically the circuit board assembly 201 to the vertical wall plate 161 and screws 211. That is, mechanical fixing means function as electrical connecting means. Therefore, the number of parts can be reduced compared with a subrack device in which mechanical securing means and electrical connecting means are provided separately. As shown in FIG. 22, the subrack device $40_{-1}$ has a rear cover 219 which covers the rear side of the BWB assembly 45.

II-10 Blank Block (FIGS. 25, 9, 10 and 11)

Figure 25:
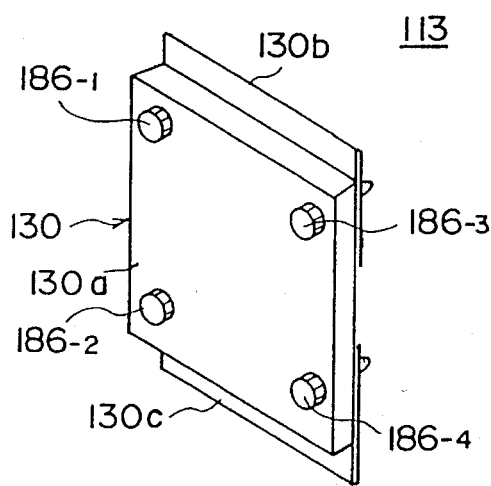
FIG. 25 is a perspective view showing a blank block.

The blank block 113 comprises a blank block body 130 and four screws $186_{-1}$–$186_{-4}$ which pass through the blank block body 130, as shown in FIG. 25.

The blank block body 130 is formed by bending a metal plate, which comprises a box portion 130a and flange portions 130b, 130c which extend upward and downward. The blank block body 130 has the same size as the outer-connecting-board $60_{-1}$ ($60_{-2}$).

The blank block 113 is mounted using screws in the outer-connecting-portion mounting territories $120_{-1}$, $120_{-3}$ in which the outer-connecting-board $60_{-1}$ ($60_{-2}$) is not mounted, as shown in FIGS. 10 and 11.

Figure 26:
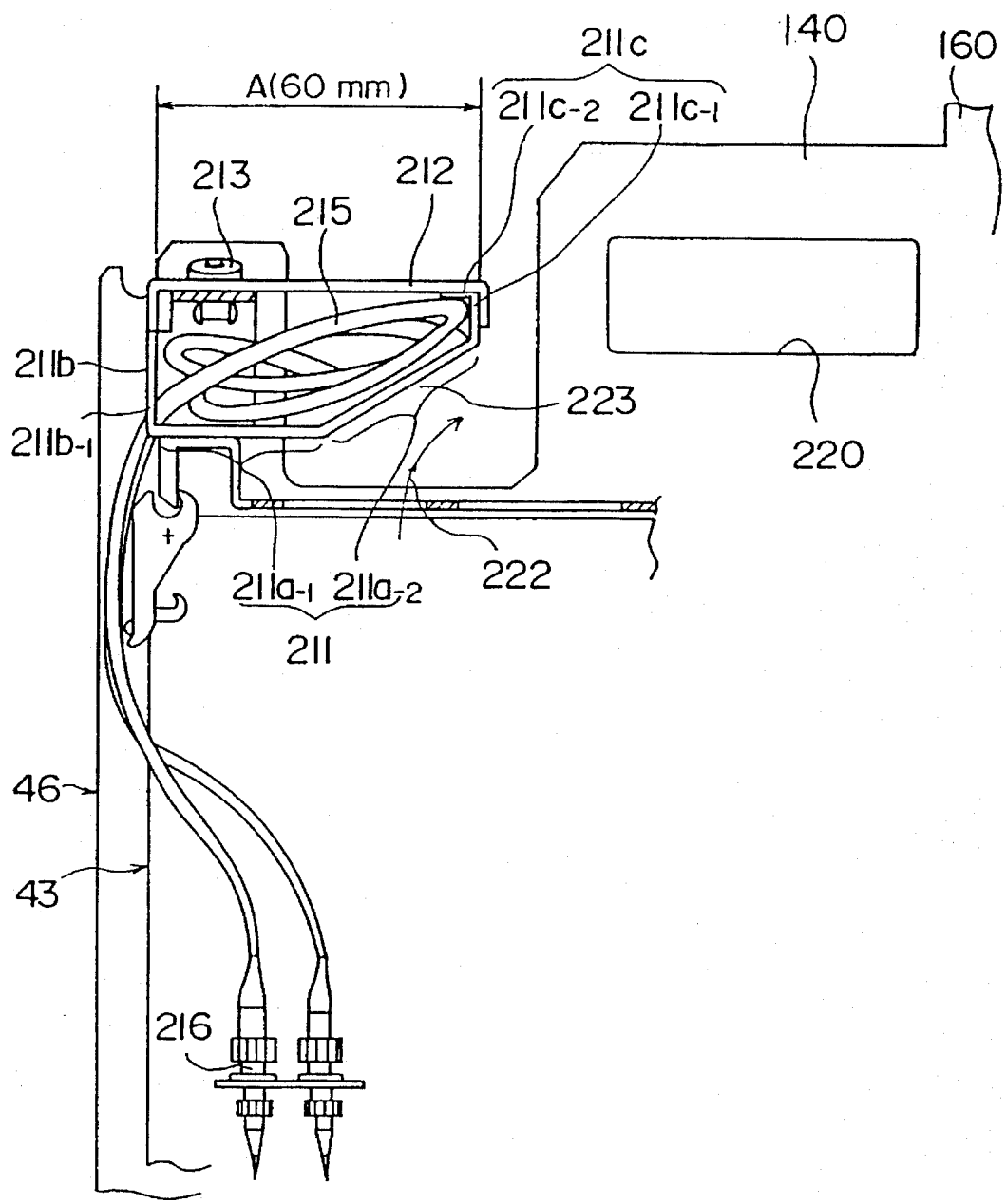
FIG. 26 is a schematic illustration showing an optical-fiber handling portion.
Figure 27:
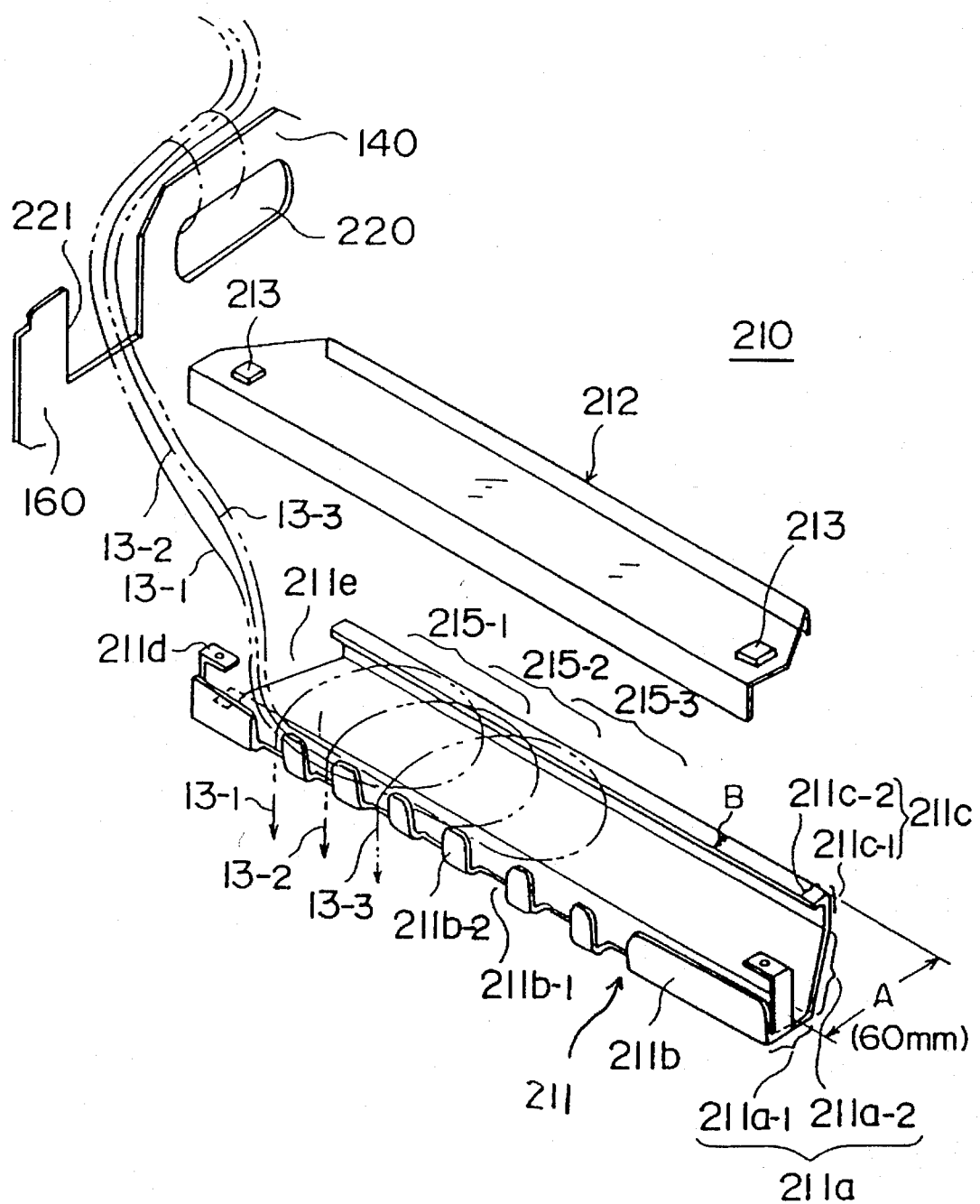
FIG. 27 is a perspective fabrication view showing an optical-fiber handling portion.

II-11 Optical-Fiber Handling Portion (FIGS. 8, 26, 27)

As shown in FIG. 8, the subrack body $21_{-1}$ has an optical-fiber handling portion 210 on a front side of the circuit-board-unit housing portion 46.

The optical-fiber handling portion 210 has an optical-fiber housing member 211 and a lid member 212 made of transparent resin. As shown in FIGS. 26 and 27, the optical-fiber housing member 211 having a rectangular shape has a bottom plate 211a, a vertical wall 211b on a front side, and a vertical wall 211c on a back side. The optical-fiber housing member 211 has a width A. The width A is 60 mm, which is twice as much as an allowable minimum bending radius of the optical-fiber. The bottom-plate portion 211a has a plate portion $211a_{-1}$ on a front side and an inclined portion $211a_{-2}$ on a back side which is inclined upward to backward. The inclined portion $211a_{-2}$ is provided in order to improve a heat release efficiency. The vertical wall 211b on the front side has a plurality of notches $211b_{-1}$. The notches $211b_{-1}$ reach the bottom-plate portion 211a. The notches $211b_{-1}$ function as passes for optical-fibers which extend downward. The vertical wall 211b on the front side has tooth portions $211b_{-2}$ between adjacent notches $211b_{-1}$. The vertical standing wall 211c on the back side comprises a vertical wall $211c_{-1}$ and a flange portion $211c_{-2}$ which is extending inside from the top of the vertical wall 211c. The flange portion $211c_{-2}$ prevents an excess length of the optical-fiber from protuberating. The width B is 5 mm. The optical-fiber housing member 211 has lid fixing portions 211d at both sides along the length.

The optical-fiber housing member 211 has a U shape observed along the width length. Both ends of the optical-fiber housing member 211 are formed in openings 211e. The optical-fiber $13_{-1}$ is introduced in the optical-fiber housing member 211. The optical-fiber $13_{-1}$ is handled by being wound counterclockwise in a space defined by the standing wall portions 211b, 211c and the front-side standing wall 211b. After that, the optical-fiber $13_{-1}$ is introduced to the circuit-board-unit housing portion 46 through the notch $211b_{-1}$. The tip end of the optical-fiber $13_{-1}$ is connected to a connector 216 of an optical-electric conversion portion of the circuit-board-unit 43, as shown in FIG. 22.

A reference numeral $215_{-1}$ indicates the excess length of the optical-fiber. The excess length of the other optical-fibers $13_{-2}$, $13_{-3}$ are handled in the same way as that of the above optical-fiber $13_{-1}$. The optical-fibers $13_{-2}$, $13_{-3}$ are introduced to the circuit-board-unit housing portion 46 through the notch $211b_{-1}$. The excess length of the optical-fiber $215_{-1}$–$215_{-3}$ are partly overlapped, as shown in FIG. 27. In the excess length of the optical-fibers $215_{-1}$–$215_{-3}$ handled by the inclined portion $211a_{-2}$, the optical-fibers adjacent to the inside standing wall portion 211c are, as shown in FIG. 26, inclined upward. In the excess length of the optical-fibers $215_{-1}$–$215_{-3}$ handled by the inclined portion $211a_{-2}$, especially the optical-fibers adjacent to the inside standing wall portion 211c tend to be protuberant. When the lid member 212 is fixed in such case, the protuberant portion of the optical-fibers is placed between the lid portion and the standing wall portion 211b on the front side, which may lead to damage to the optical-fibers.

On the contrary, since the flange portion $211c_{-2}$ is provided in this embodiment, protuberant portions of the excess length of the optical-fibers $215_{-1}$$215_{-3}$ are held down by the under-surface of the flange portion $211c_{-2}$. Thus, when the lid portion is fixed on the optical-fiber housing portion 211, the optical-fibers are not placed between them and the optical-fiber is not damaged. The lid member 212 is fixed on the optical-fiber housing member 211 covering the excess length of the optical-fibers $215_{-1}$–$215_{-3}$ by fixing tools 213, as shown in FIG. 26. Since the lid member 212 is transparent, the optical-fiber in the optical-fiber housing unit 211, particularly, how the excess length is handled, how the optical-fiber moves when the circuit board is mounted or removed, can be observed from outside. In FIG. 27, at the top of the vertical standing wall 211b (tooth portion $211b_{-2}$), a flange of a bent shape can be provided.

II-12 Structure Relating to the Optical-Fiber Handling Portion

A handle 140 for tying the optical-fibers $131_{-1}$–$13_{-3}$ is formed by forming an opening 220 by pressing a part of the side plate 160 of the chassis assembly 44, as shown in FIGS. 26 and 27. The side plate 140 has a U-shaped notch 221, as shown in FIG. 25. The U-shaped notch 221 functions as an introducing hole of the subrack device for the optical-fibers $13_{-1}$–$13_{-3}$, as shown in FIG. 27.

An inclined portion $211a_{-2}$ of the bottom plate portion 211a of the optical-fiber housing member 211 defines a pass 223 for air current 222 rising from the circuit-board-unit housing portion 46, as shown in FIG. 26. By the features described above, the air current 222 flows smoothly compared with a subrack device having only a flat bottom-plate portion 211a but not having the inclined portion $211a_{-2}$. Thus, in the circuit-board-unit housing portion 46, smooth air currents are available and a heat generated in the circuit-board-unit 43 can be released efficiently.

II-13 Reinforcement Board of a Circuit-Board-Unit Housing Portion (FIGS. 8, 22, 28, 29, 30)

Figure 28:
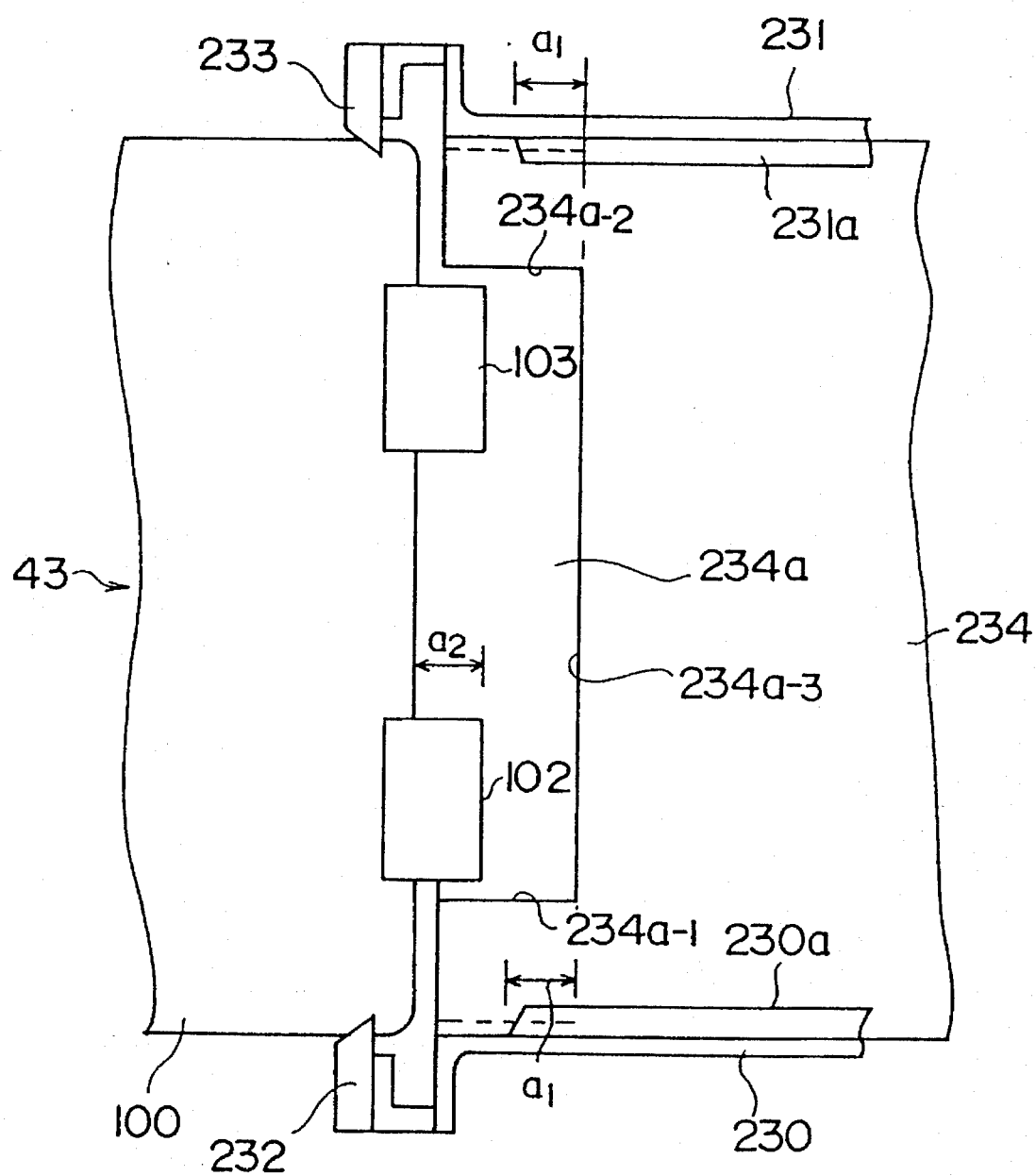
FIG. 28 is a schematic illustration showing a circuit-board-unit housing portion.

As shown in FIGS. 14 and 28, the circuit-board-unit housing portion 46 has side boards 160 provided on both right and left sides, a bottom plate 230, a top plate 231, receiving members 232, 233 and a reinforcing plate 234.

In the bottom plate 230 and the top plate 231, the guide rail 231 is provided. The reinforcing plate 234 is provided between the side plates 160 on both the right side and the left side in the same direction of the circuit-board-unit, which is parallel to the housed circuit-board-unit. The reinforcing plate 234 is secured to the bottom plate 230 and top plate 231 by screws to reinforce the circuit-board-unit housing portion 46 of the box shape. The receiving members 232, 233 are respectively secured on a front side of the bottom plate 230 and the top plate 231. In the bottom plate 230 and the top plate 231, the guide rails 230a, 231a are provided to guide the bottom and top portions of the circuit board 100 of the circuit-board-unit 43.

The reinforcing plate 234 has notches 234a of a rectangular shape in one edge adjacent to a circuit-board-unit insertion opening of the circuit-board-unit housing portion 46. The notch 234a has a size in which the connectors 102, 103 of the circuit-board-unit 43 can be included just after the circuit board unit 43 is inserted.

The size of the notch 234a is determined based on the circuit-board-unit 43 in the following way.

Lower edge $234a_{-1}$: Little bit lower than the lower edge of the connector 102

Upper edge $234a_{-2}$: Little bit higher than the top edge of the connector 102

Internal edge $234a_{-3}$: $a_{-1} > a_{-2}$

In the above, $a_{-1}$ indicates a distance from the beginning end of the guide rail 230a (231a) to the edge $234a_{-3}$ and $a_{-2}$ indicates a length of the connectors 102, 103 which protrudes from the circuit board.

Next, advantages of the above notch 234a will be described. The notch 234a prevents the connectors 102, 103 from colliding with the reinforcing plate 234 when the circuit-board-unit 43 is inserted into the guide rail 230a, 231a in a wrong way, as shown in FIGS. 29, 30.

Figure 29:
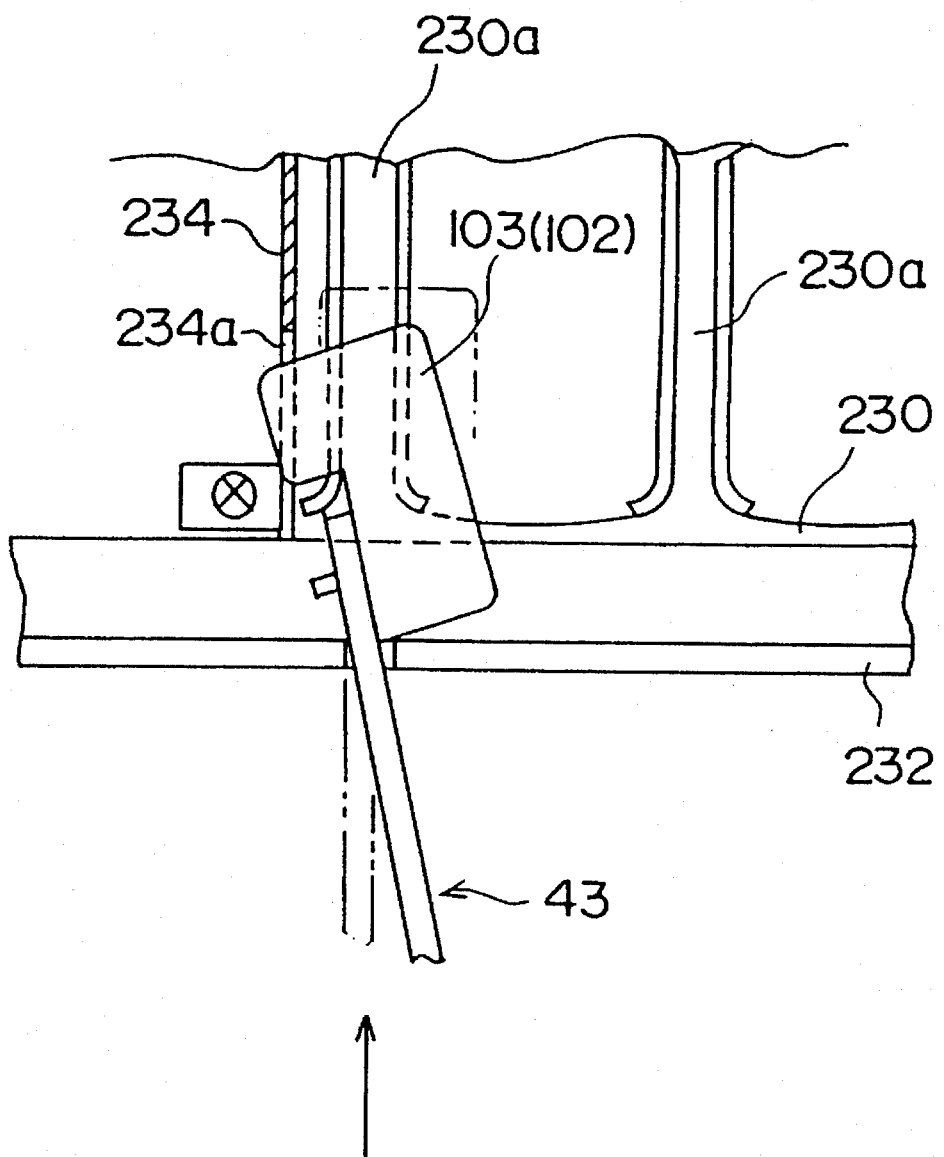
FIG. 29 is a schematic illustration showing the circuit-board-unit inserted improperly.

FIG. 29 shows the circuit-board-unit 43 inserted in a left direction, which is different from a proper direction. The connector 103 (102) is accepted in the notch 234a and does not collide against the reinforcing plate 234. When the circuit-board-unit 43 is inserted deeply and the circuit board 100 is guided by the guide rails 230a, 231a, the circuit-board-unit 43 is corrected in position as shown by two-dotted-chain line in FIG. 29, which is a normal position of the circuit-board-unit 43. Thus, the circuit-board-unit 43 is inserted without the connectors 102, 103 colliding against the reinforcing plate 234.

Figure 30:
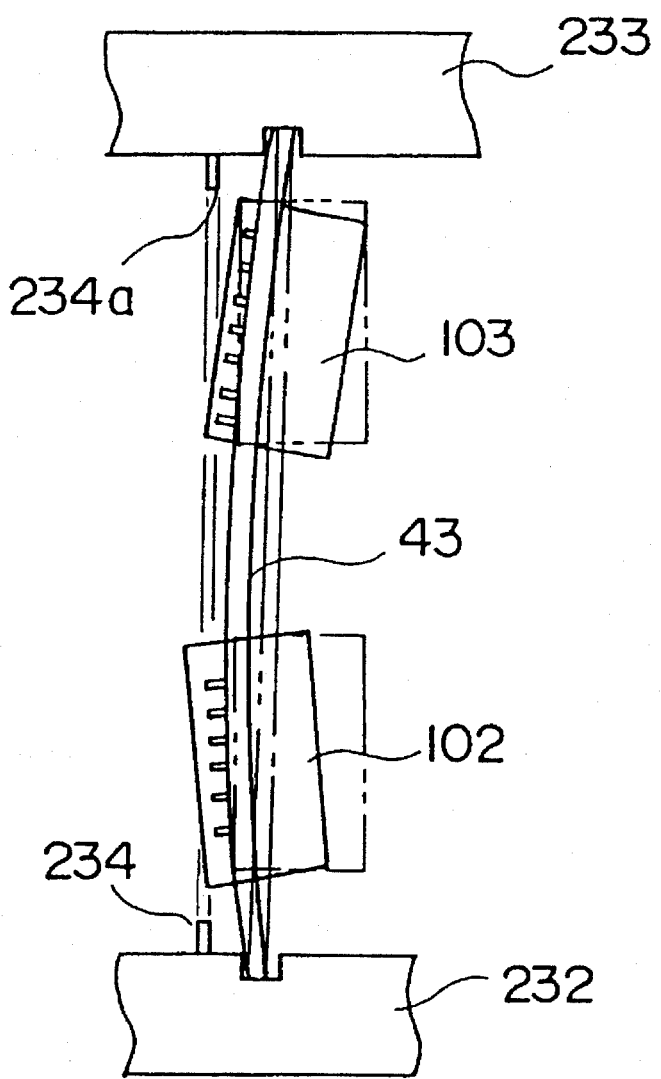
FIG. 30 is a schematic illustration showing a warped circuit-board-unit.

FIG. 30 shows the circuit-board-unit 43 warped when it is inserted. In this case also, the connectors 102, 103 are accepted in the notch 234a and do not collide against the reinforcing plate 234. When the circuit-board-unit is inserted deeply and the circuit board 100 is guided by guide rails 230a, 231a, the warped circuit-board-unit 43 is corrected to a normal shape as shown by a two-dotted-chain line. Thus, the circuit-board-unit 43 is inserted without the connectors 102, 103 colliding against the reinforcing plate 234.

Figure 31A:
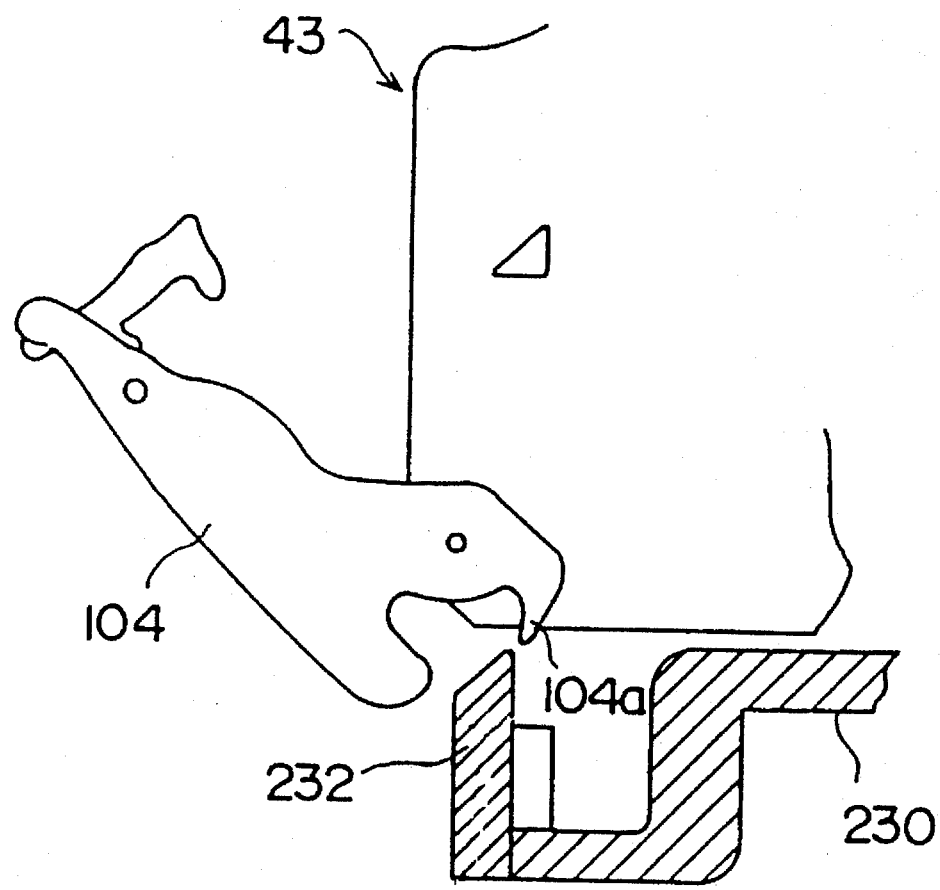
FIG. 31 is a schematic illustration showing a receiving member.
Figure 31B:
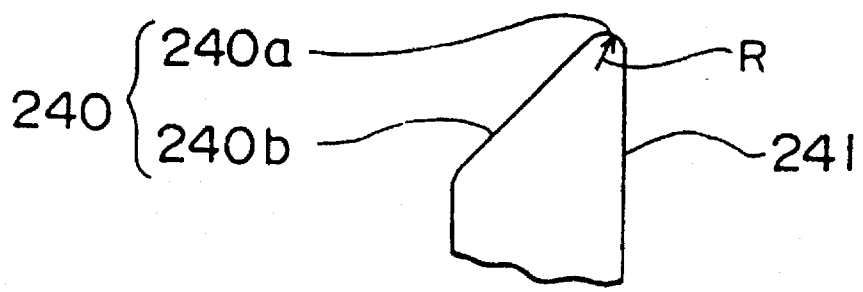

II-14 Receiving Member of the Circuit-Board-Unit Housing Portion (FIGS. 8, 31, 32)

The receiving member 232 has an upper surface 240, as shown in FIG. 31. In FIG. 31, X1 represents an insertion direction of the circuit-board-unit 43 and X2 represents a pulling-out direction thereof.

The upper surface 240 comprises a tip head portion 240a provided in an end towards the $X_1$ direction and an inclined face inclining downward towards the X2 direction. The tip head portion 240a has a round portion whose radius R is 0.1 mm. When the circuit-board-unit 43 is inserted and the card lever 104 is turned clockwise, the stopper portion of the card lever 104 is engaged with an inner surface 241 of the receiving member 232 and the circuit-board-unit 43 is connected to the BWB assembly 45 properly.

When the circuit-board-unit 43 is inserted in an improper slot and the card lever 104 is turned clockwise, the stopper nail portion 104a slides on the inclined surface portion 240b. Thus, the receiving member 232 is not urged downward and the circuit-board-unit housing portion 46 is not damaged. Also, a strong force is not applied to the circuit-board-unit 43 and the circuit board 100 and the card lever 104 are not damaged. The upper-side receiving member 232 has a symmetrical shape to the receiving member 232 and the functions the same as the receiving member 232. The above structure is especially effective when a unit-insertion-error insertion-error preventing portion has a small size in a front-back direction and a distance between the position of the circuit-board-unit at which the circuit-board-unit contacts the unit-insertion-error preventing portion and a position of a pin when the circuit-board-unit contacts the unit-insertion-error preventing portion.

Figure 32A:
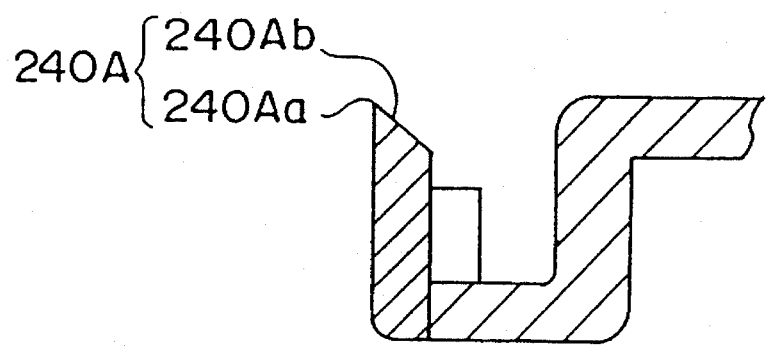
FIGS. 32A and 32B are schematic illustrations showing variations of the receiving member.
Figure 32B:
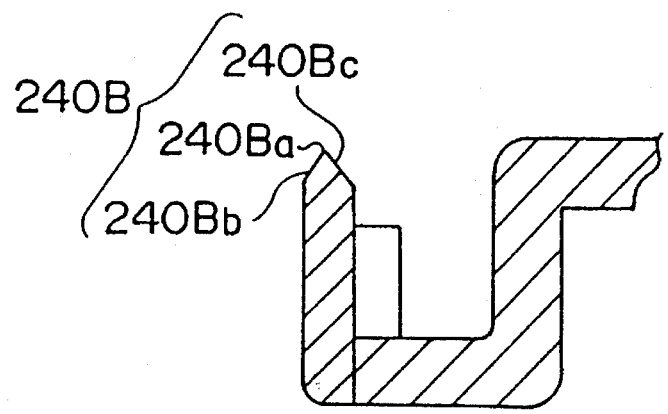

FIGS. 32A and 32B show variations of the receiving member.

A receiving member 232A shown in FIG. 32A has an upper surface 240A. The upper surface 240A comprises a tip head portion 240Aa provided at an end towards the X2 direction and an inclined surface 240Ab inclined downward toward the X1 direction. A receiving member 232B shown in FIG. 32B has an upper surface 240B. The upper surface 240B comprises a tip head portion 240Ba provided in the middle and inclined surfaces 240Bb, 240Bc provided at both sides of the tip head portion 240Ba. The above receiving members 232A, 232B function approximately the same as the receiving member 232.

III Subrack Device of Another Embodiment

Figure 33:
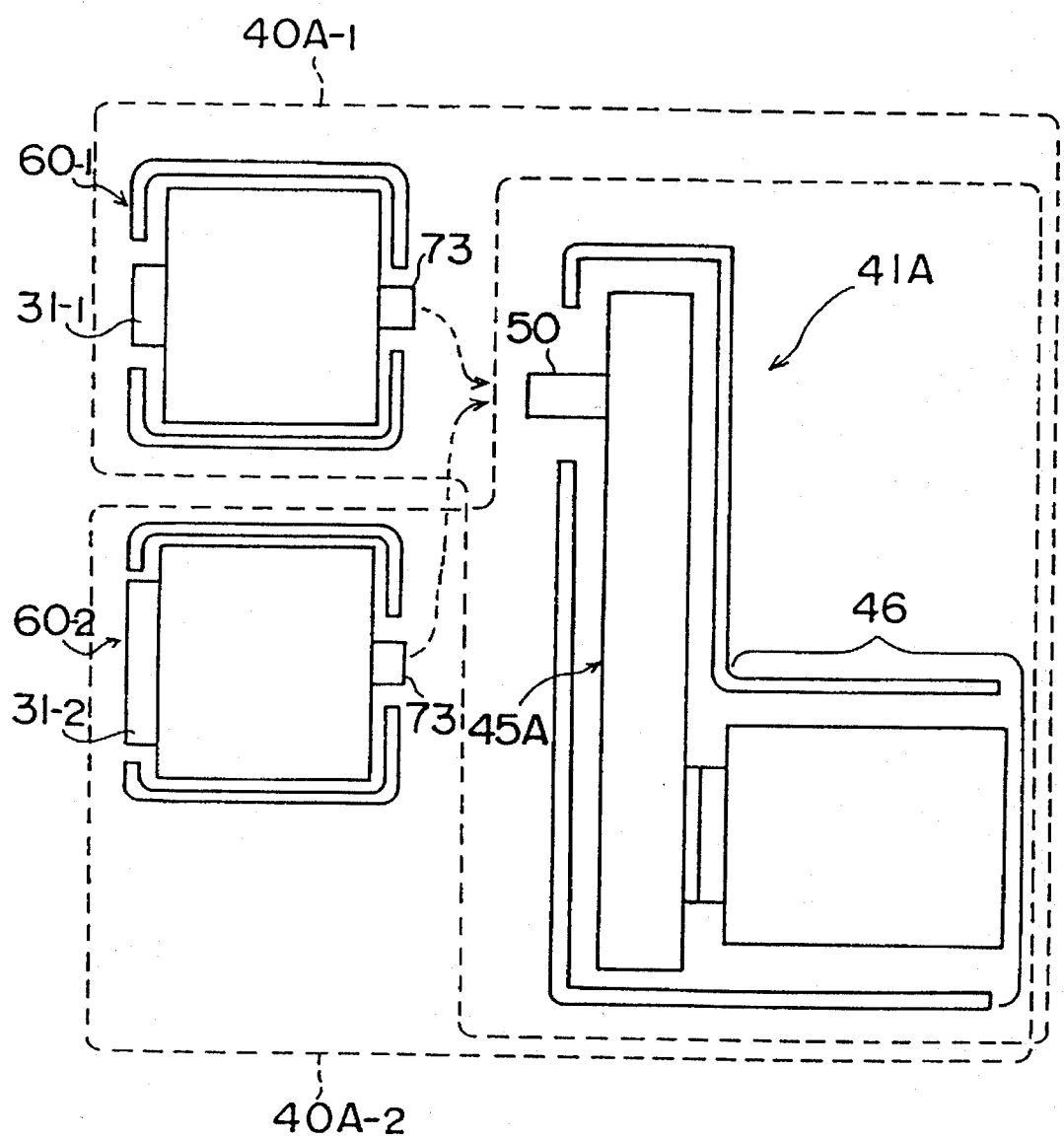
FIG. 33 is a schematic illustration showing a subrack device of another embodiment of the present invention.

FIG. 33 shows subrack devices $40A_{-1}$, $40A_{-2}$ of another embodiment. In the subrack devices $40A_1$, $40A_{-2}$, the outer-connecting-boards $60_{-1}$, $60_{-2}$ are respectively plugged in the rear side of the circuit-board-unit housing portion 46 in the common structure 41A.

Further, the present invention is not limited to these embodiments, but various variations and modifications may be made without departing from the scope of the present invention.

What is claimed is:

1. A subrack device comprising:

a subrack body comprising a chassis assembly and a back-wiring-board assembly, said subrack body having a circuit-board-unit housing portion in which a circuit-board-unit is accommodated and an outer-connecting-board mounting portion in which an outer-connecting-board is plugged, said outer-connecting-board mounting portion having a first connector; and a circuit-board-unit which is accommodated in said circuit-board-unit housing portion of said subrack body, said circuit-board-unit being connected to said back-wiring-board assembly;

said outer-connecting-board having a second connector to be connected to said first connector, said outer-connecting-board being plugged in said outer-connecting-board mounting portion of said subrack body by connecting said second connector to said first connector;

said outer-connecting-board being selected from outer-connecting-boards having different functions and different outer connectors in response to said different functions.

2. The subrack device according to claim 1, wherein said outer-connecting-board mounting portion has a plurality of outer-connecting-board mounting territories, each of said outer-connecting-board mounting territories designed to be mounted by one of said outer-connecting-boards.

3. The subrack device according to claim 1, wherein said outer-connecting-board has a rectangular shape and said outer-connecting-board is arranged facing said outer-connecting-board mounting portion.

4. The subrack device according to claim 1, wherein said outer-connecting-board mounting portion is a part of said chassis assembly used for grounding, said outer-connecting-board comprising a circuit board assembly and a rectangular shield box in which said circuit board assembly is accommodated, and a back face of said shield box contacts with said chassis assembly when said outer-connecting-board is mounted on said outer-connecting-board mounting portion.

5. The subrack device according to claim 1, wherein said outer-connecting-board mounting portion has a positioning hole, said outer-connecting-board protruding from a back side of said outer-connecting-board mounting portion, said outer-connecting-board having a positioning pin having a tapered or spherical tip end, said positioning pin being engaged with said positioning hole when said outer-connecting-board is mounted.

6. The subrack device according to claim 1, wherein said outer-connecting-board mounting portion comprises a vertical wall plate of said chassis assembly and a back-wiring-board assembly positioned in a back side of said vertical wall plate, said outer-connecting-board having a positioning pin protruding from a back side of said outer-connecting-board, said back-wiring-board assembly comprising a back-wiring-board and said first connector mounted on said back-wiring-board, said back-wiring-board having a positioning hole with which said positioning pin is engaged, said vertical wall plate having a positioning hole with which said positioning pin is engaged loosely, said positioning pin first engaging with said positioning hole of said vertical wall plate and secondly engaging with said positioning hole of said back-wiring-board when said outer-connecting-board is mounted.

7. The subrack device according to claim 4, wherein said circuit board assembly has an impedance conversion transformer.

8. The subrack device according to claim 4, wherein said circuit board assembly has a filtering circuit.

9. The subrack device according to claim 1, wherein said subrack body further comprises a circuit board assembly having a power-source connector and a filtering circuit, and fixing/connecting means for fixing mechanically said circuit board assembly to said chassis assembly at a plurality of points and connecting electrically said filtering circuit to said chassis assembly at a plurality of points.

10. The subrack device according to claim 1, wherein said circuit-board-unit housing portion of said subrack body has a reinforcing plate member, said reinforcing plate member having a notch at an insertion side thereof, said reinforcing plate member being provided vertically in said circuit-board-unit housing portion.

11. The subrack device according to claim 1, wherein said circuit-board-unit has a unit insertion/removing tool, said circuit-board-unit housing portion of said subrack body having a receiving member with which said unit insertion/removing tool is engaged when said circuit-board-unit is mounted, and said receiving member having a cross section having a tip head shape in an insertion direction of said circuit-board-unit.

12. The subrack device according to claim 1, wherein said subrack body further comprises an optical-fiber handling portion which handles an excess length of said optical-fiber, said optical-fiber handling portion comprising an optical-fiber housing member in which said optical-fiber handled by said optical-fiber handling portion is accommodated and a lid member which covers said optical-fiber housing member, said optical-fiber housing member comprises a vertical wall portion and a flange portion extending inside of said optical-fiber housing member from a top of said optical-fiber housing member.

13. The subrack device according to claim 12, wherein said lid member is transparent.

14. The subrack device according to claim 12, wherein said optical-fiber housing member has a bottom-plate portion inclined upward toward a back side thereof.

15. The subrack device according to claim 1, wherein said chassis body has a side plate, said side plate having a handle relatively formed by forming an opening in said side plate.

16. The subrack device according to claim 1, wherein said chassis body has a side plate, said side plate having a notch portion through which an optical-fiber is introduced into said chassis body.

17. The subrack device according to claim 1, wherein said back-wiring-board assembly has only press-fit parts mounted on said back-wiring-board, said outer-connecting-board having a circuit board assembly, said circuit board assembly having only solder-jointed parts mounted on said circuit board.

* * * * *